United States Patent
Jensen et al.

(10) Patent No.: US 12,191,230 B2
(45) Date of Patent: Jan. 7, 2025

(54) TECHNOLOGIES FOR LIQUID COOLING SYSTEMS

(71) Applicant: Intel Corporation, Santa Clara, CA (US)

(72) Inventors: Ralph W. Jensen, Tumwater, WA (US); Michael Thomas Crocker, Portland, OR (US); Wesley B. Morgan, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 691 days.

(21) Appl. No.: 17/213,347

(22) Filed: Mar. 26, 2021

(65) Prior Publication Data

US 2021/0242108 A1   Aug. 5, 2021

(51) Int. Cl.
*H01L 23/433* (2006.01)
*H01L 25/18* (2023.01)

(52) U.S. Cl.
CPC .......... *H01L 23/4336* (2013.01); *H01L 25/18* (2013.01)

(58) Field of Classification Search
CPC ......... H01L 2224/131; H01L 2924/014; H01L 2924/00014
See application file for complete search history.

(56) References Cited

U.S. PATENT DOCUMENTS

| | | | |
|---|---|---|---|
| 5,871,042 A * | 2/1999 | Gutfeldt | H01L 23/473 257/E23.098 |
| 10,048,008 B1 * | 8/2018 | Mounioloux | F28D 1/05366 |
| 11,324,143 B2 * | 5/2022 | Stefanoski | H05K 7/20509 |
| 2007/0050980 A1 * | 3/2007 | Vetter | B23K 11/14 257/E23.098 |
| 2013/0248114 A1 * | 9/2013 | Seok | H01L 24/81 156/382 |
| 2016/0218264 A1 * | 7/2016 | Tischler | H01L 33/62 |

(Continued)

FOREIGN PATENT DOCUMENTS

| | | |
|---|---|---|
| GB | 2576030 | 2/2020 |
| GB | 2576032 | 2/2020 |

(Continued)

OTHER PUBLICATIONS

ChillDyne Liquid Cooling Solutions System Overview, available at https://chilldyne.com, accessed Sep. 27, 2022 (6 pages).

(Continued)

*Primary Examiner* — Xanthia C Relford
(74) *Attorney, Agent, or Firm* — HANLEY, FLIGHT & ZIMMERMAN, LLC

(57) ABSTRACT

Techniques for liquid cooling systems are disclosed. In one embodiment, jet holes in a water block create jets of liquid coolant to be applied to a surface to be cooled, such as a surface of an integrated circuit component. The jets of liquid coolant may disrupt surface boundary layers through turbulence and/or microcavitation, increasing the cooling effect of the liquid coolant. In the illustrative embodiment, negative pressure is applied to a coolant loop of the liquid coolant, which provides several advantages such as being resistant to leaks. In another embodiments, jet holes in a water block create jets of liquid coolant that are directed toward other jets of liquid coolant, which also increases the cooling effect of the liquid coolant.

19 Claims, 14 Drawing Sheets

(56) References Cited

U.S. PATENT DOCUMENTS

| | | | |
|---|---|---|---|
| 2018/0035569 A1* | 2/2018 | Harrington | H05K 7/20281 |
| 2018/0240767 A1* | 8/2018 | Liu | H01L 27/1214 |
| 2018/0343774 A1* | 11/2018 | Smith | G06F 1/206 |
| 2019/0239388 A1* | 8/2019 | Tsai | H05K 7/20254 |
| 2020/0235082 A1 | 7/2020 | Eid et al. | |
| 2020/0258815 A1* | 8/2020 | Suzuki | F28F 3/12 |
| 2021/0320048 A1* | 10/2021 | Limaye | H01L 23/427 |
| 2021/0320050 A1 | 10/2021 | Robinson et al. | |
| 2021/0321526 A1* | 10/2021 | Kulkarni | H05K 5/06 |
| 2021/0398895 A1 | 12/2021 | Elsherbini et al. | |
| 2021/0407903 A1 | 12/2021 | Elsherbini et al. | |

FOREIGN PATENT DOCUMENTS

| | | |
|---|---|---|
| GB | 2597525 | 2/2022 |
| GB | 2601357 | 6/2022 |

OTHER PUBLICATIONS

Walsh, Stephen Michael, Microjet Impingement Cooling of High Power-Density Electronics, 2018 Massachusetts Institute of Technology, 93 pages.

Dymyd, Lesya et al., "Open Compute Project, Design Guidelines for Immerson-Cooled IT Equipment, Revision 1.0," Creative Commons Attribution-Sharalike 4.0, Dec. 3, 2020 (41 pages).

Iceotope, "Five Delicious Flavours of Liquid Cooling for Data Centres?," Oct. 22, 2020, Available online at https://www.iceotope.com/insights/five-delicious-flavours-of-liquid-cooling-for-data-centres/. (4 pages).

U.S. Appl. No. 17/359,342, filed Jun. 25, 2021 entitled Technologies for Sealed Liquid Cooling System.

"Cold Spraying;" Wikipedia, as accessed Oct. 28, 2021 at https://en.wikipedia.org/wiki/Cold_spraying, 6 pages.

U.S. Appl. No. 17/484,213, filed Sep. 24, 2021 entitled Conformal Power Delivery Structures (54 pages).

U.S. Appl. No. 17/484,299, filed Sep. 24, 2021, entitled Conformal Power Delivery Structures Near High-Speed Signal Traces (74 pages).

United States Patent and Trademark U.S. Appl. No. 17/484,384, filed Sep. 24, 2021 entitled Cooling of Conformal Power Delivery Structures (72 pages).

Glynn et al., "Jet Impingement Cooling," 9th UK National Heat Transfer Conference, Manchester, 2005.

Ijiri et al., "Evolution of Microstructure from the Surface to the Interior of Cr—Mo Steel by Water Jet Peening," Materials Sciences and Applications, 2017, 8, 708-715.

ChillDyne Liquid Cooling Solutions System Overview, available at http://www.chilldyne.com/wp-content/uploads/2019/12/Chilldyne-Liquid-Cooling-System-2019.pdf, accessed May 6, 2021 (2 pages).

"What is the current state of microscale 3D printing?," available at https://www.3dnatives.com/en/what-is-the-current-state-of-microscale-3d-printing/, accessed May 6, 2021 (10 pages).

* cited by examiner

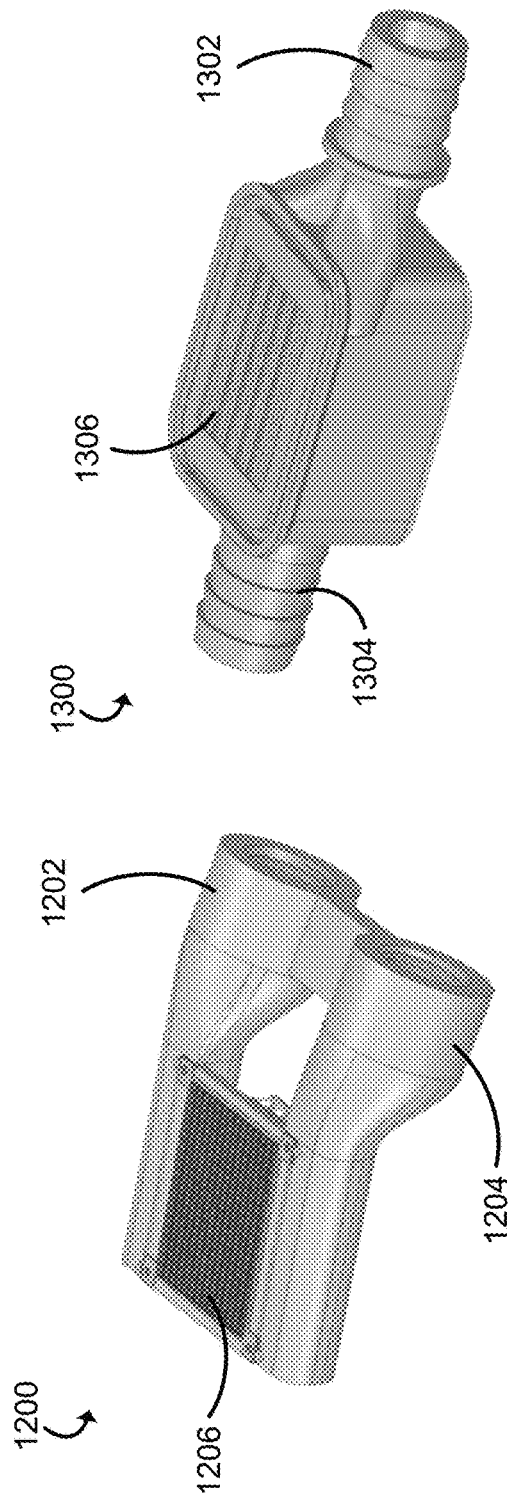
FIG. 12
FIG. 13
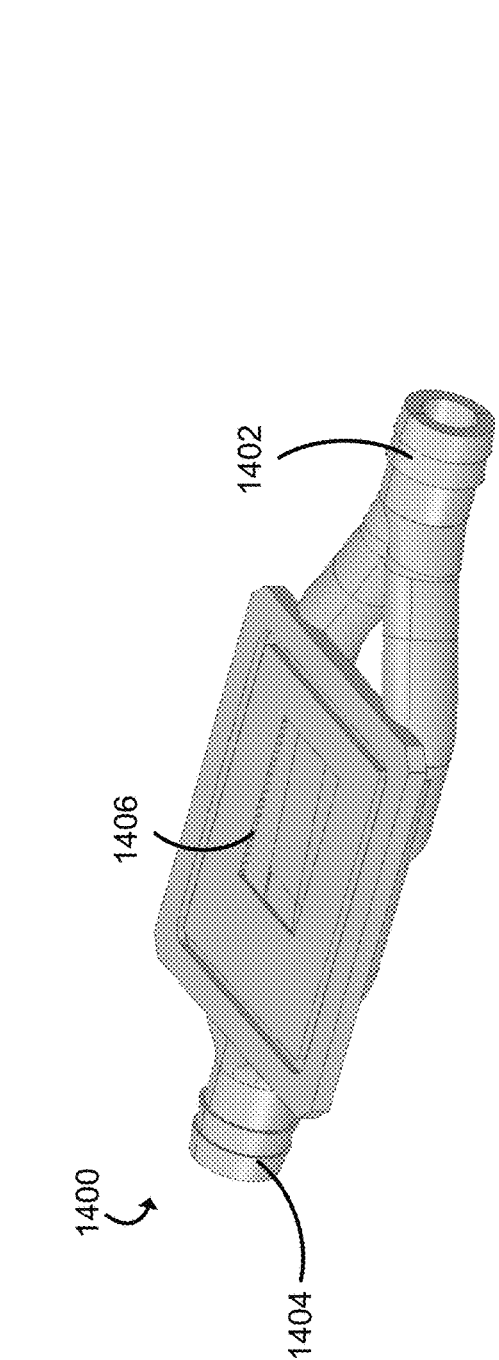
FIG. 14

TECHNOLOGIES FOR LIQUID COOLING SYSTEMS

GOVERNMENT RIGHTS

This invention was made with government support under Agreement No. HR0011-17-3-0004 awarded by DARPA. The Government has certain rights in the invention.

BACKGROUND

Components such as processors dissipate large amounts of heat, which must be removed to prevent the components from overheating. Air cooling by passing air through fins of a heat sink coupled to the component can provide cooling, but air cooling is limited by the relatively low heat capacity of air. Liquid cooling can take advantage of the large heat capacity of water and other liquids relative to air.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

FIG. 12 is a perspective view of one embodiment of a water block;

FIG. 13 is a perspective view of one embodiment of a water block;

FIG. 14 is a perspective view of one embodiment of a water block;

DETAILED DESCRIPTION OF THE DRAWINGS

Liquid cooling can move large amounts of heat from components in computing devices such as processors. In some cases, boundary layers in the interface between the liquid and the component being cooled may reduce the effectiveness of heat transfer to the liquid. In some embodiments disclosed herein, jets may be used to induce high turbulence and/or cavitation, increasing the heat transfer to the liquid. An additional challenge in liquid cooling is managing leaks in a system. In some embodiments disclosed herein, the liquid cooling system is under negative pressure, resulting in air leaking into the liquid cooling system instead of the coolant leaking out.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. The term "coupled," "connected," and "associated" may indicate elements electrically, electromagnetically, thermally, and/or physically (e.g., mechanically or chemically) co-operate or interact with each other, and do not exclude the presence of intermediate elements between the coupled, connected, or associated items absent specific contrary language. Terms modified by the word "substantially" include arrangements, orientations, spacings, or positions that vary slightly from the meaning of the unmodified term. For example, surfaces described as being substantially parallel to each other may be off of being parallel with each other by a few degrees.

The description may use the phrases "in an embodiment," "in embodiments," "in some embodiments," and/or "in various embodiments," each of which may refer to one or more of the same or different embodiments. Furthermore, the terms "comprising," "including," "having," and the like, as used with respect to embodiments of the present disclosure, are synonymous.

Reference is now made to the drawings, wherein similar or same numbers may be used to designate the same or similar parts in different figures. The use of similar or same numbers in different figures does not mean all figures including similar or same numbers constitute a single or same embodiment. In the following description, for purposes of explanation, numerous specific details are set forth in order to provide a thorough understanding thereof. It may be evident, however, that the novel embodiments can be practiced without these specific details. In other instances, well-known structures and devices are shown in block diagram form to facilitate a description thereof. The intention is to cover all modifications, equivalents, and alternatives within the scope of the claims.

Figure 1:
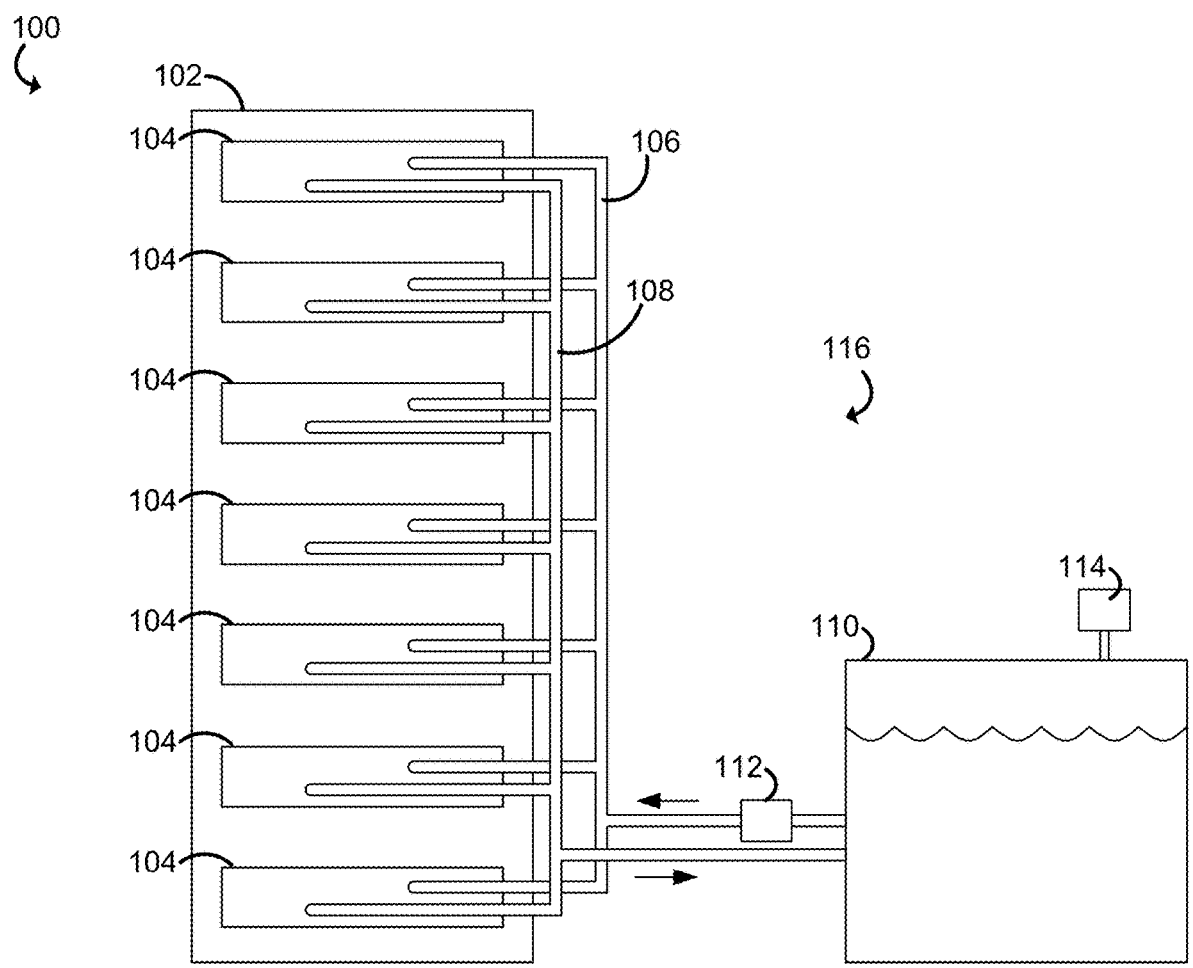
FIG. 1 is a simplified block diagram of a system for liquid cooling a rack of computing devices.

Referring now to FIG. 1, in one embodiment, an illustrative system 100 includes a rack 102 with several computing devices 104. Each illustrative computing device 104 is connected to a liquid cooling supply line 106 and to a liquid cooling return line 108. In use, a coolant loop 116 is established between the supply line 106, the return line 108, and a reservoir 110 of liquid coolant. A pump 112 supplies liquid coolant to the supply line 106, which cools one or more components in each computing device 104. The liquid coolant flows into the return line 108 and returns to the reservoir 110. A pump 114 pumps air out of the reservoir 110, maintaining the pressure in the reservoir 110 (and in the supply line 106 and return line 108) below atmospheric pressure. As a result of the negative pressure, in the cooling lines, small leaks (such as inside a computing device 104) will result in air leaking into the cooling lines, not coolant leaking out of the cooling lines. Air leaking into the cooling lines will return to the reservoir 110, where it can be pumped out by the pump 114, maintaining the negative pressure in the cooling lines.

In the illustrative embodiment, the liquid cooling supply line 106 and liquid cooling return line 108 are made out of flexible polyvinyl chloride (PVC). In other embodiments, the liquid cooling supply line 106 and return line 108 may be made of any suitable material, such as plastic, copper or other metal, etc. In the illustrative embodiment, the supply line 106 and return line 108 fed to each computing device 104 has an inner diameter of ¼ inches and an outer diameter of ⅜ inches. The supply line 106 and return line 108 going to and from the reservoir 110 may have a larger inner diameter, such as 12 to 4 inches in diameter. In other embodiments, the supply line 106 and return line 108 may have any suitable inner diameter, such as ⅛ to 6 inches, and any suitable outer diameter such as 3/16 to 7 inches.

The illustrative reservoir 110 may hold any suitable amount of liquid, such as 1-1,000 liters. In some embodiments, the reservoir 110 may hold an amount of liquid that is proportional to the number of computing devices 104 the reservoir serves, such as 0.1-2 liters per computing device 104. The reservoir 110 may also hold any suitable amount of air, such as 1-1,000 liters or 0.1-2 liters per computing device 104. The liquid coolant in the reservoir 110 may be maintained at any suitable temperature at, below, or above room temperature, such as 0-50° Celsius.

The pump 112 may be any suitable pump, such as a centrifugal pump, an axial pump, a positive displacement pump, etc. In the illustrative embodiment, the pump 112 pumps about 1 cubic centimeter per second of coolant per computing device 104. In other embodiments, the pump 112 may pump any suitable volume, such as 0.1-50 cubic centime per second per computing device 104. In the illustrative embodiment, the pump 112 increases the pressure in the supply line 106 by about 1 psi. In other embodiments, the pump 112 may increase the pressure by 0.1-10 psi. In embodiments in which a negative pressure relative to atmospheric pressure is used, the pump 112 does not increase the pressure in the supply line 106 above atmospheric pressure. In the illustrative embodiment, if a large leak is present, the pump 112 may not be able to overcome the negative pressure created by the pump 114, cause coolant to flow backward through the pump 112, preventing or at least partially mitigating leaks.

The pump 114 may be any suitable pump, such as a positive displacement pump, a reciprocating-piston pump, a diaphragm pump, a rocking-piston pump, etc. The pump 114 may maintain the pressure in the reservoir 110 at any suitable value, such as 0.5-12 psi below atmospheric pressure. In the illustrative embodiment, the pump 114 maintains the pressure in the reservoir 110 at about 2 psi below atmospheric pressure. The pump 114 may be able to pump air out of the reservoir at any suitable flow rate, such as 0.1-10 cubic centimeters per second, or 0.1-10 cubic centimeters per second per computing device 104.

The system 100 may include additional components not shown. For example, the reservoir 110, supply line 106, and/or return line 108 may be connected to a radiator, a heat exchanger, a chiller, or other cooling mechanisms to prevent the temperature of the coolant in the reservoir 110 from rising. The racks 102 may be located any suitable distance away from the reservoir 110, such as 5-100 meters. The system 100 may include various connectors, splitters, manifolds, manual and automatic valves, pumps, filters, etc. In one embodiment, the system 100 may include a 5 micrometer high capacity filter to remove sediment and other debris from the coolant. The system 100 may include any suitable number of racks 102, such as 1-10,000 racks 102, each of which may include any suitable number of computing devices 104, such as 1-16 computing devices 104.

Figure 2:
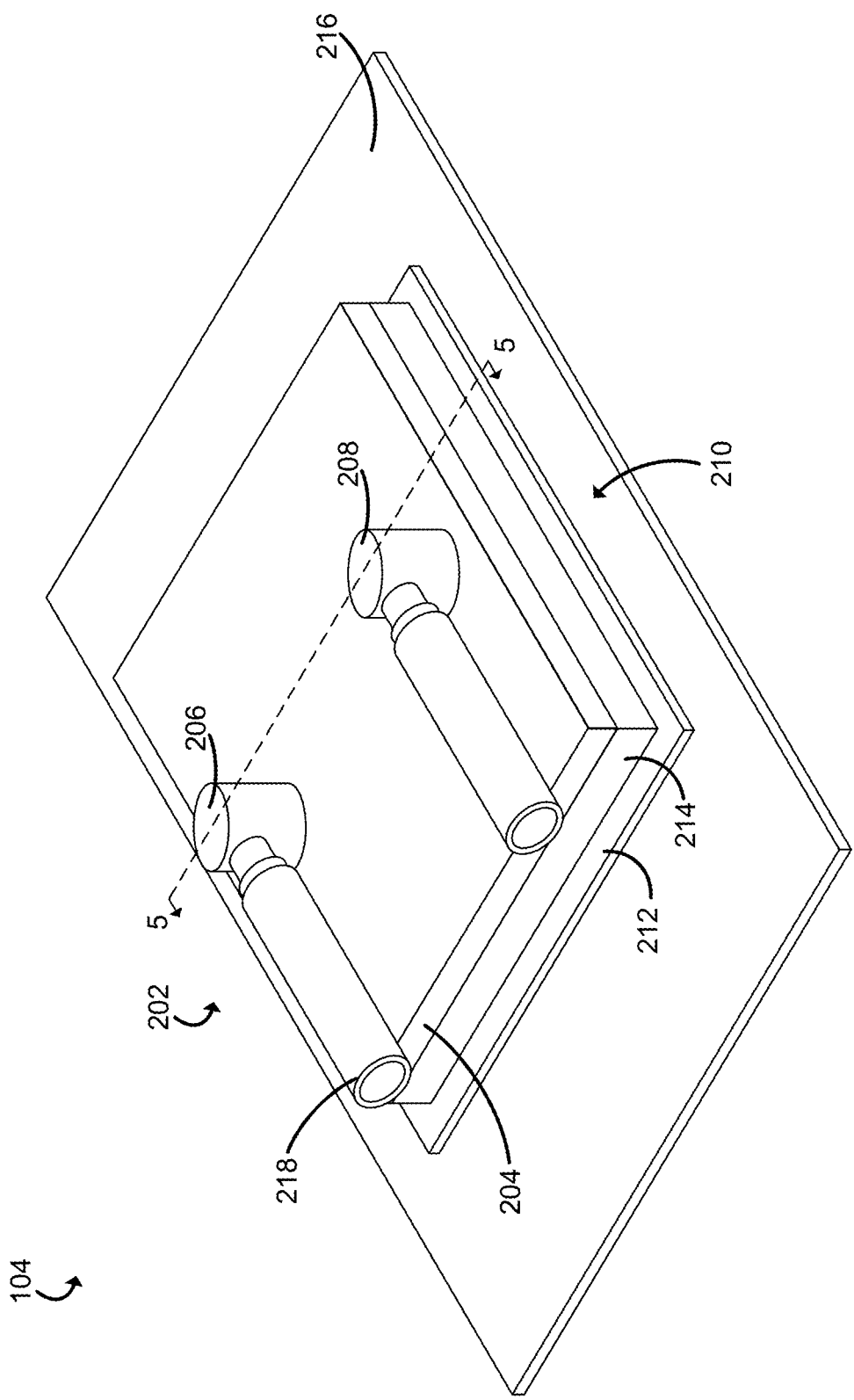
FIG. 2 is a perspective view of a simplified diagram of at least one embodiment of a computing system with a water block.
Figure 3:
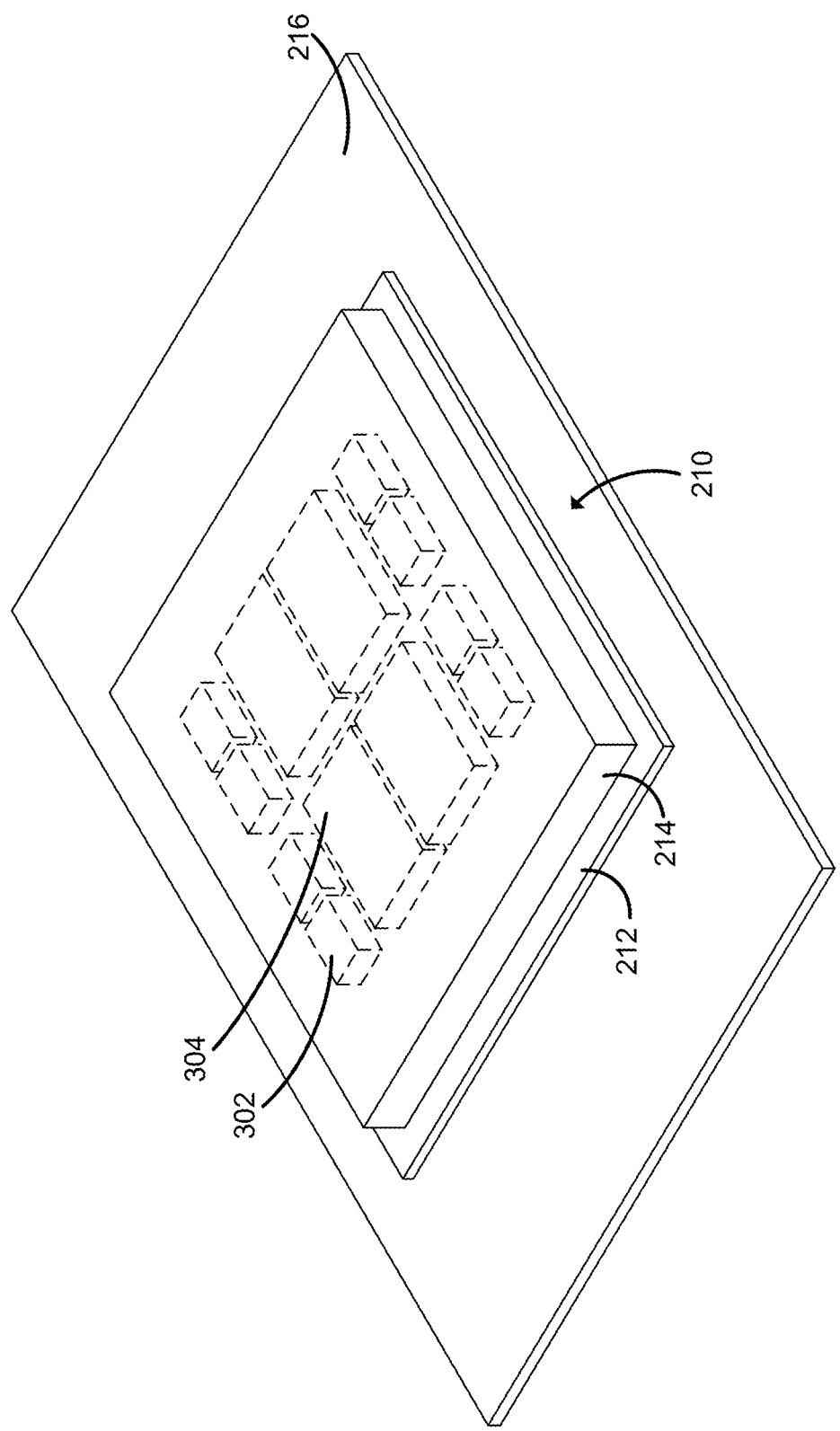
FIG. 3 is a perspective view of a simplified diagram showing the system of FIG. 1 without the water block.

Referring now to FIG. 2, in one embodiment, an illustrative computing device 104 includes a water block 202, an integrated circuit component 210 (not visible in FIG. 1), and a system board 216. The water block 202 has a base 204, an inlet 206, and an outlet 208. Tubes 218 are connected to the inlet 206 and outlet 208 to supply and return liquid coolant. The tubes 218 may be connected to a reservoir (such as reservoir 110) to form a coolant loop (such as coolant loop 116). FIG. 3 shows the integrated circuit component 210 and the system board 216 without the water block 202. The integrated circuit component 210 includes an integrated heat spreader (IHS) 214 mounted on a substrate 212. In use, in the illustrative embodiment, the base 204 of the water block 202 is thermally coupled to the integrated heat spreader 214, absorbing heat from the integrated circuit component 210. The inlet 206 and the outlet 208 are fluidly coupled by an internal channel defined in the water block 202. As used herein, the phrase "thermally coupled" refers to components that are coupled to facilitate the transfer of heat, and the phrase "fluidly coupled" refers to components that are coupled to facilitate the flow of a fluid between them.

Figure 4:
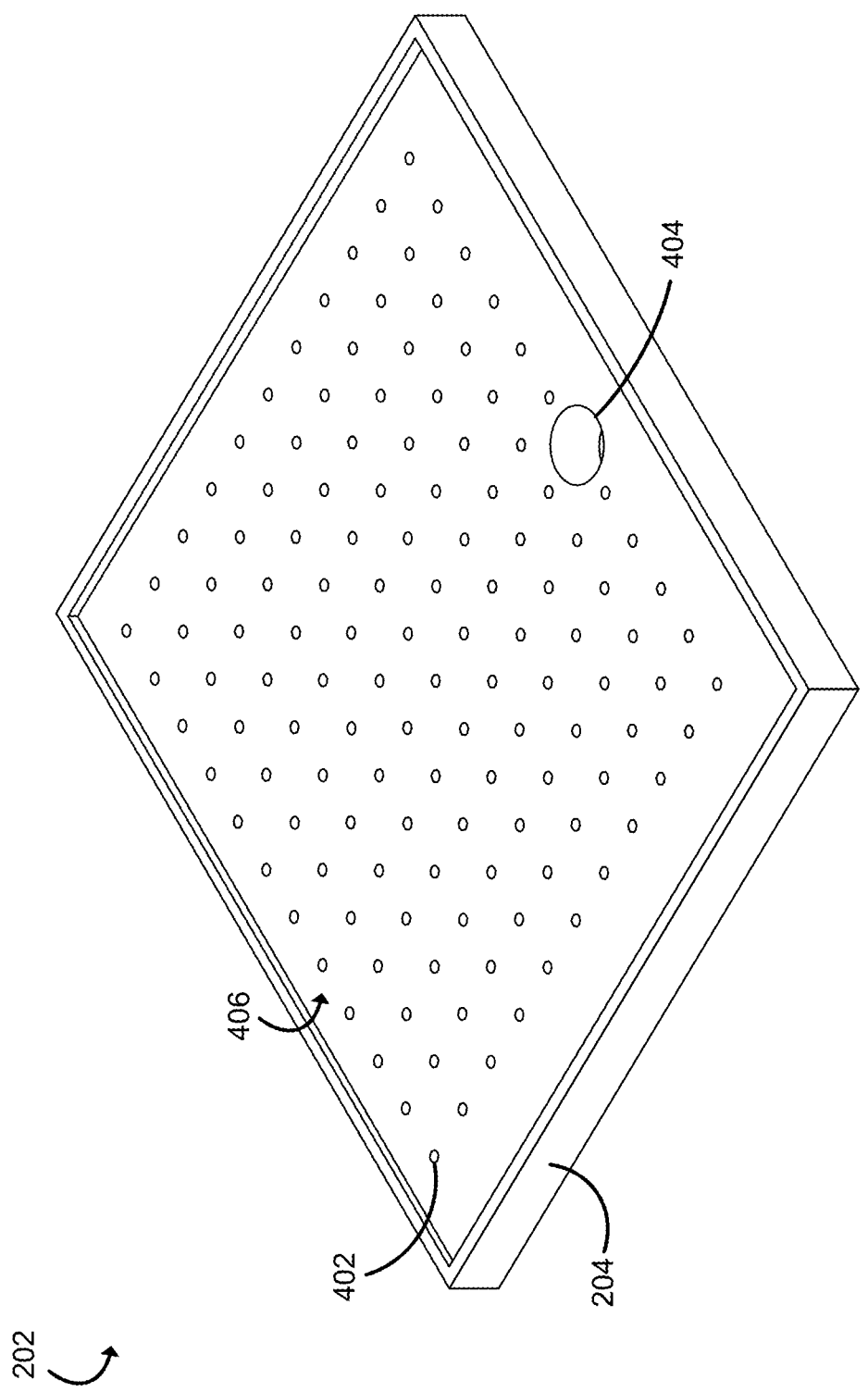
FIG. 4 is a perspective view of a bottom side of one embodiment of the water block of FIG. 2.
Figure 5:
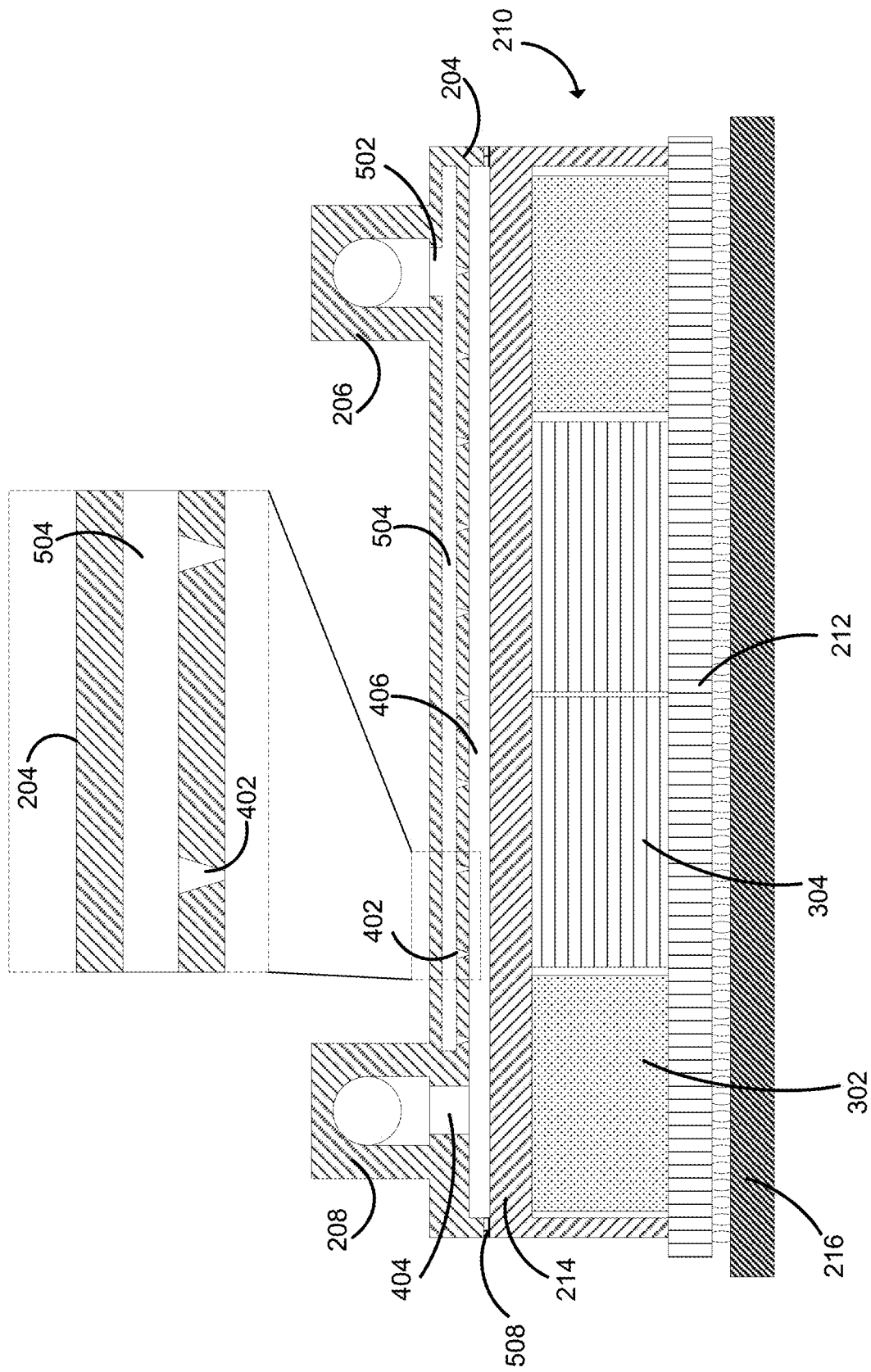
FIG. 5 is a cross-section view of the system of FIG. 2.

Referring now to FIGS. 4 & 5, in one embodiment, more detailed diagrams of the water block 202 are shown. FIG. 4 shows an underside of the water block 202, and FIG. 5 shows a cross-section view that corresponds to view 5 marked in FIG. 2. As shown in FIGS. 4 & 5, the illustrative water block 202 has a plurality of jet holes 402 defined in the base 204 of the water block 202. Each of the jet holes 402 is fluidly coupled to the inlet 206 and outlet 208 In use, liquid coolant flows into the water block 202 through the inlet 206. The liquid coolant is passed from the inlet 206, through a channel 502 in the base 204 to an inlet chamber 504. The liquid coolant is then passed through the jet holes 402, which apply jets of liquid coolant that are directed into an outlet chamber 406 and toward the IHS 214 of the integrated circuit component 210. In some embodiments, the liquid coolant may pass through fine channels before entering each jet hole 402. In the illustrative embodiment, the jets of liquid coolant create high turbulence and/or microcavitation near the surface of the IHS 214, disrupting any boundary layers that may otherwise form and increasing heat transfer from the IHS 214 to the liquid coolant. The liquid coolant then flows back through a channel 404 connected to the outlet 208.

In the illustrative embodiment, the computing device 104 is embodied as a server, blade, or sled in a rack 102 of a data center. In other embodiments, the computing device 104 may be a desktop computer, a server computer, a sled, a blade, a networking device, a communication device, etc.

In the illustrative embodiment, the system board 216 may be embodied as a motherboard. The system board 216 may include other components not shown, such as interconnects, other electrical components such as capacitors or resistors, sockets for components such as memory or peripheral cards, connectors for peripherals, etc. In other embodiments, the system board 216 may form or be a part of another component of a computing device, such as a peripheral card, a graphics card, a mezzanine board, a peripheral board, etc. The illustrative system board 216 is a fiberglass board made of glass fibers and a resin, such as FR-4. In other embodiments, other types of circuit boards may be used.

In the illustrative embodiment, the integrated circuit component 210 is embodied as a processing unit of a computing device. More generally, as used herein, the term "integrated circuit component" refers to a packaged or unpacked integrated circuit product. A packaged integrated circuit component comprises one or more integrated circuits. In one example, a packaged integrated circuit component contains one or more processor units and a land grid array (LGA) or pin grid array (PGA) on an exterior surface of the package. In one example of an unpackaged integrated circuit component, a single monolithic integrated circuit die comprises solder bumps attached to contacts on the die. The solder bumps allow the die to be directly attached to a printed circuit board. An integrated circuit component can comprise one or more of any computing system component or type of component described or referenced herein, such as a processor unit (e.g., system-on-a-chip (SoC), processor cores, graphics processor unit (GPU), accelerator), I/O controller, chipset processor, memory, network interface controller, or a three-dimensional integrated circuit (3D IC) face-to-face-based packaging chip such as an Intel® Foveros chip. In one embodiment, the integrated circuit component 210 is a processor unit, such as a single-core processor, a multi-core processor, a desktop processor, a server processor, a data processing unit, a central processing unit, a graphics processing unit, etc. The processor unit may include an integrated memory, such as a high-bandwidth memory. The integrated circuit component 210 may include one or more chips integrated into a multi-chip package (MCP). For example, in one embodiment, the integrated circuit component 210 may include one or more processor chips 304 and one or more memory chips 302. In some embodiments, the integrated circuit component 210 may be embodied as or otherwise include one or more semiconductor lasers or light emitting devices.

The illustrative integrated circuit component 210 includes an IHS 214. The IHS 214 is in thermal contact with the dies of the integrated circuit component 210, either directly or through one or more intermediate layers, such as a thermal interface material (TIM). The illustrative IHS 214 is made out of nickel-plated copper. In other embodiments, the IHS 214 may be made out of or otherwise include any suitable material, such as copper, aluminum, gold, or other high-thermal-conductivity material. In some embodiments, the integrated circuit component 210 may not include an IHS (see, e.g., FIGS. 8-10). In such an embodiment, the base 204 of the water block 202 may contact the dies included in the integrated circuit component 210 without an intermediate IHS. In those embodiments, there may or may not be other layers such as a TIM between the water block 202 and the bare integrated circuit die(s) of the integrated circuit component 210, as described in more detail below.

The illustrative IHS 214 may be any suitable size. The illustrative IHS 214 has a width of about 30 millimeters, a length of about 60 millimeters, and a height of 5 millimeters. In other embodiments, the IHS 214 may have any suitable dimensions, such as a length and/or width of 50-200 millimeters and a height of 0.5-20 millimeters.

The illustrative substrate 212 includes interconnects to connect electrical paths of the dies of the integrated circuit component 210 both to each other and to external connections, such as to pins of a socket or solder bumps. In some embodiments, the substrate 212 may include embedded multi-die interconnect bridge (EMIB) technology. In the illustrative embodiment, the substrate 212 includes a land grid array of pads. Each pad may be any suitable material, such as gold, copper, silver, gold-plated copper, etc. Additionally or alternatively, in some embodiments, the substrate 212 may include a pin grid array with one or more pins that mate with a corresponding pin socket in a processor socket or a ball grid array. The substrate 212 may include one or more additional components, such as a capacitor, voltage regulator, etc. The illustrative substrate 212 is a fiberglass board made of glass fibers and a resin, such as FR-4. In other embodiments, the substrate 212 may be embodied as any suitable circuit board.

In the illustrative embodiment, the substrate 212 has larger dimensions than the IHS 214 and/or the dies mounted on the substrate 212. The illustrative substrate 212 has a width of about 40 millimeters, a length of about 70 millimeters, and a height of 3 millimeters. In other embodiments, the substrate 212 may have any suitable dimensions, such as a length and/or width of 50-200 millimeters and a height of 0.5-20 millimeters. In some embodiments, the substrate 212 may not extend past the IHS 214. In other embodiments, the integrated circuit component 210 may not include a separate substrate 212. Rather, the dies or other components inside a package may, e.g., contact pins on a processor socket directly.

In the illustrative embodiment, the integrated circuit component 210 may have a thermal interface material (TIM) layer between some or all of the dies and the IHS 214. A TIM layer can be any suitable material, such as a silver thermal compound, thermal grease, phase change materials, indium foils, or graphite sheets. Additionally or alternatively, there may be a TIM layer between the integrated circuit component and the water block 202.

The various dies of the integrated circuit component 210 may generate any suitable amount of heat. For example, in one embodiment, the integrated circuit component 210 may generate up to 500 Watts of power. The power may be split between the various dies in any suitable manner. The integrated circuit component 210 may be maintained at less than any suitable temperature, such as 50-150° C.

In the illustrative embodiment, using the jet holes 402 to create jets of liquid coolant allows for a large amount of cooling. For example, in the illustrative embodiment, the water block 202 may be able to remove over 250 kW/(m$^2$×° C.). In other embodiments, the water block 202 may be able to remove 10-250 kW/(m$^2$×° C.). In one embodiment, the jet holes 402 can cool 1 kW/cm$^2$. In other embodiments, the jet holes 402 can cool, e.g., 0.1-2 kW/cm$^2$.

The water block 202 may be made from any suitable material. It should be appreciated that, in the illustrative embodiment, the material of the base 204, inlet 206, and outlet 208 do not directly participate in transferring heat from the integrated circuit component 210 to the liquid coolant. As such, the base 204, inlet 206, and outlet 208 can be a low-thermal-conductivity material without a significant impact on the ability of the water block 202 to cool the integrated circuit component 210. Accordingly, in the illustrative embodiment, the water block 202 may be made of any suitable polymer or other plastic. In some embodiments, some or all of the water block 202 may be made of a high thermal conductivity material, such as copper or aluminum.

The water block 202 may have any suitable shape or dimensions. For example, the water block 202 may have a width of 10-250 millimeters, a length of 10-250 millimeters, and/or a height of 5-100 millimeters. In the illustrative embodiment, the water block 202 has a width of about 75 millimeters, a length of about 75 millimeters, and a height of about 15 millimeters. The water block 202 may be any suitable shape, such as a square, a rectangle, a circle, etc. In some embodiments, the water block 202 may include more than one chamber 406 into which jets are directed. For example, in some embodiments, the water block 202 may be thermally coupled to more than one integrated circuit component 210 (such as any combination of one or more of a processor, a memory, an accelerator, a storage device, etc.), and some of the integrated circuit components 210 may be thermally coupled to liquid coolant in different chambers 406. In such embodiments, the water block 202 may include channels connecting the inlet 206 and outlet 208 to each chamber 406 and each set of jet holes 402 that feed into a chamber 406. As there are channels in the water block 202 connecting the different chambers 406, no additional tubing may be required to provide liquid coolant to each of the integrated circuit components 210. In such embodiments, the water block 202 may be any suitable size, such as a width and/or length of 10-1,000 millimeters.

The illustrative water block 202 is bonded to the IHS 214 by an adhesive 508 between the base 204 of the water block 202 and the IHS 214. The adhesive 508 may permanently bond the water block 202 to the IHS 214, or the water block 202 may be removable even with the adhesive 508. In some embodiments, there may be a diaphragm between the water block 202 and the IHS 214. In the illustrative embodiment, the adhesive 508 may form a water-tight seal between the water block 202 and the IHS 214 as a result of the negative pressure of the liquid coolant on the inside of the water block 202, resulting in the atmosphere on the outside of the water block 202 pushing down on the water block 202, pressing it onto the IHS 214. In other embodiments, the adhesive 508 may form a water-tight seal between the water block 202 and the IHS 214 without any pressure difference between the inside and outside of the water block 202. Additionally or alternatively, in some embodiments, the water block 202 may be connected to the system board 216, such as by springs, bolts, clips, or light bails.

In the illustrative embodiment, each of the jet holes 402 has a diameter of about 100 micrometers. In other embodiments, the jet holes 402 may be any suitable diameter, such as 25-500 micrometers. It should be appreciated that, in some embodiments, the diameter of the jet holes 402 may impact the creation of turbulence and/or microcavitation. The liquid coolant may come out of the jet holes 402 at any suitable velocity, such as 0.1-10 meters per second. In the illustrative embodiment, the liquid coolant comes out of the jet holes 402 at approximately 1 meter per second. The pressure drop across the jet holes 402 may be any suitable amount, such as 0.1-10 psi. In the illustrative embodiment, the pressure drop across the jet holes 402 is about 1 psi.

The jet holes 402 may be any suitable distance from the IHS 214 or other surface being cooled. In the illustrative embodiment, the jet holes 402 are separated from the IHS 214 by a distance of 250 micrometers. In other embodiments, the jet holes 402 may be, e.g., 25-1,500 micrometers from the IHS 214 or other surface being cooled. In some embodiments, the jet holes 402 may be a distance away from the jet holes 402 that is proportional to the diameter of the jet hole 402, such as 0.25-10 times the diameter of the jet hole 402. It should be appreciated that, in the illustrative embodiment, the jet cooling described herein does not require any fins or additional convective structure to maintain sufficient cooling. Additionally, the effectiveness of the jets in cooling can lead to efficient cooling with a relatively low volume and/or flow rate of the liquid coolant.

The water block 202 may include any suitable number of jet holes 402. In the illustrative embodiment, the water block 202 includes about 1,500 jet holes 402. In other embodiments, the water block 202 may include 10-10,000 jet holes 402. The water block 202 may include jet holes 402 at any suitable density, such as 10-1,000 per square centimeter. In the illustrative embodiment, the water block 202 has 50-100 jet holes 402 per square centimeter. In the illustrative embodiment, the jet holes 402 are uniformly distributed. In other embodiments, the concentration of jet holes 402 may vary. For example, a water block 202 may include a larger number of jet holes 402 over areas that generates larger amounts of heat and may include a smaller number of jet holes 402 over areas that generates lower amounts of heat.

In the illustrative embodiment, the liquid coolant is water, such as deionized water. In other embodiments, other fluids may be used, such as alcohol, glycol, and/or any other suitable fluid or mix of fluids. In some embodiments, different combinations of fluids may be used that are in different phases when the jets impinge the surface to be cooled (or, in the case of self-impinging jets described below in regard to FIG. 10, when the jets impinge another jet). The water or other cooling liquid may have certain additives such as anti-microbial additives. It should be appreciated that, in some embodiments, the water block 202 may have liquid coolant in it other than water, despite the name.

In the illustrative embodiment, the water block 202 is manufactured at least partially using additive manufacturing (e.g., 3D printing). For example, in one embodiment, a surface including the jet holes 402 is 3D printed using a high-resolution 3D printer, while other components water block 202 (such as other components of the base 204, the inlet 206, the outlet 208) may be created in a different manner, such as injection molding, extrusion, skiving, stamping, forging, machining, 3D printing, etc. The components made using different techniques may be connected together in any suitable manner, such as by hot plate welding, adhesive welding, overmolding, crimping, etc. Any suitable 3D printing technology may be used, such as fusion deposition modeling (FDM) or stereolithography (SLA). In the illustrative embodiment, the 3D printing technology may able to create jet holes 402 with a diameter as low as 25-100 micrometers.

The tubes 218 connected to each of the inlet 206 and outlet 208 may be made from any suitable material, such as flexible polyvinyl chloride (PVC). In the illustrative embodiment, the tubes 218 have an inner diameter of ¼ inches and an outer diameter of ⅜ inches. In other embodiments, the tubes 218 may have any suitable inner diameter, such as ⅛ to 2 inches, and any suitable outer diameter such as 3⁄16 to 2.5 inches. The tubes 218 may be connected to fittings in a sled or blade that are also mated with the supply line 106 and return line 108, connected the inlet 206 and outlet 208 to the reservoir 110. The fittings may be any suitable type of fitting, such as a barbed fitting, a push-to-connect fitting, a fitting with a tube 218 held in place using a clip or other retainer, etc.

Figure 6:
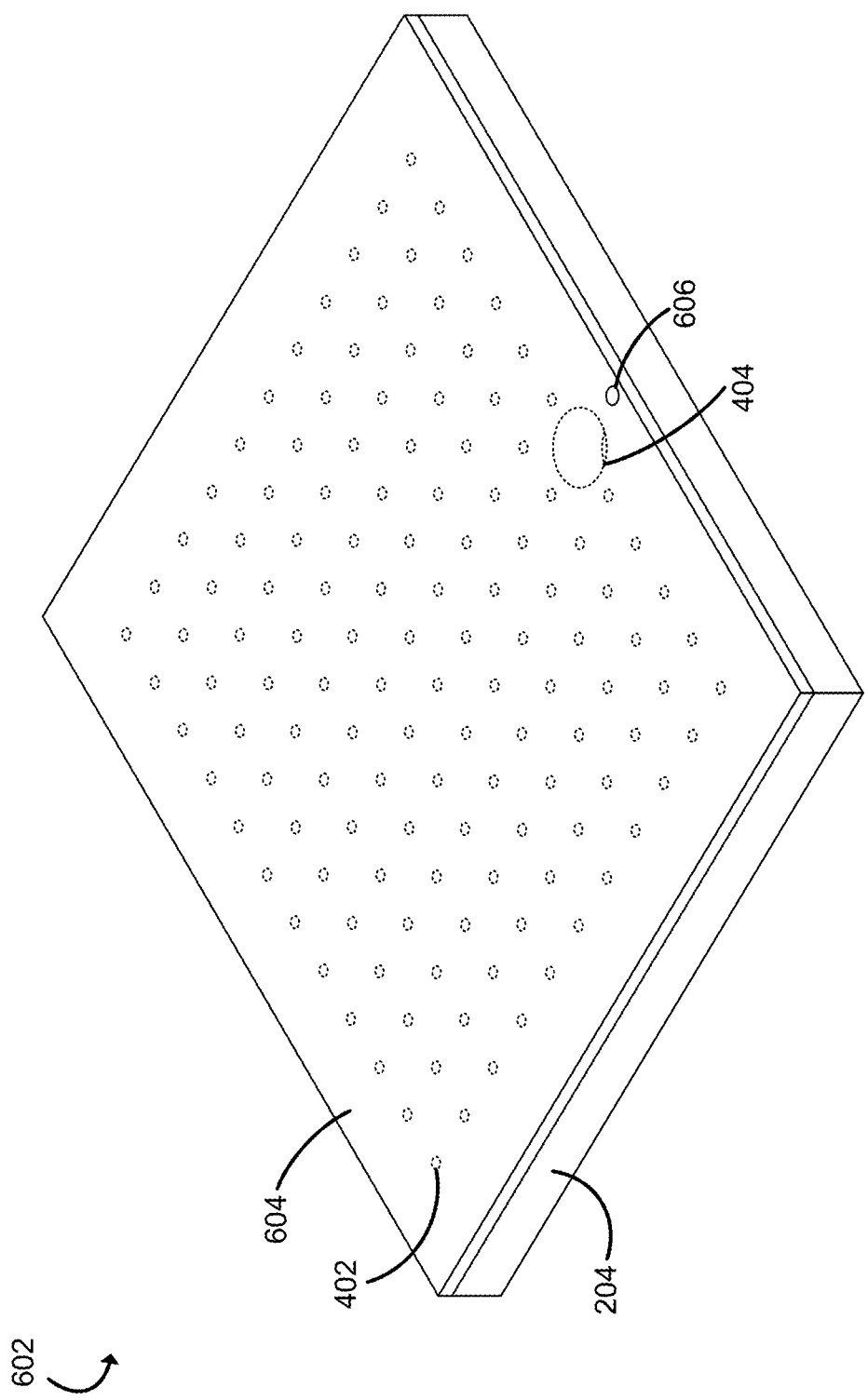
FIG. 6 is a perspective view of a bottom side of a water block with a cold plate.
Figure 7:
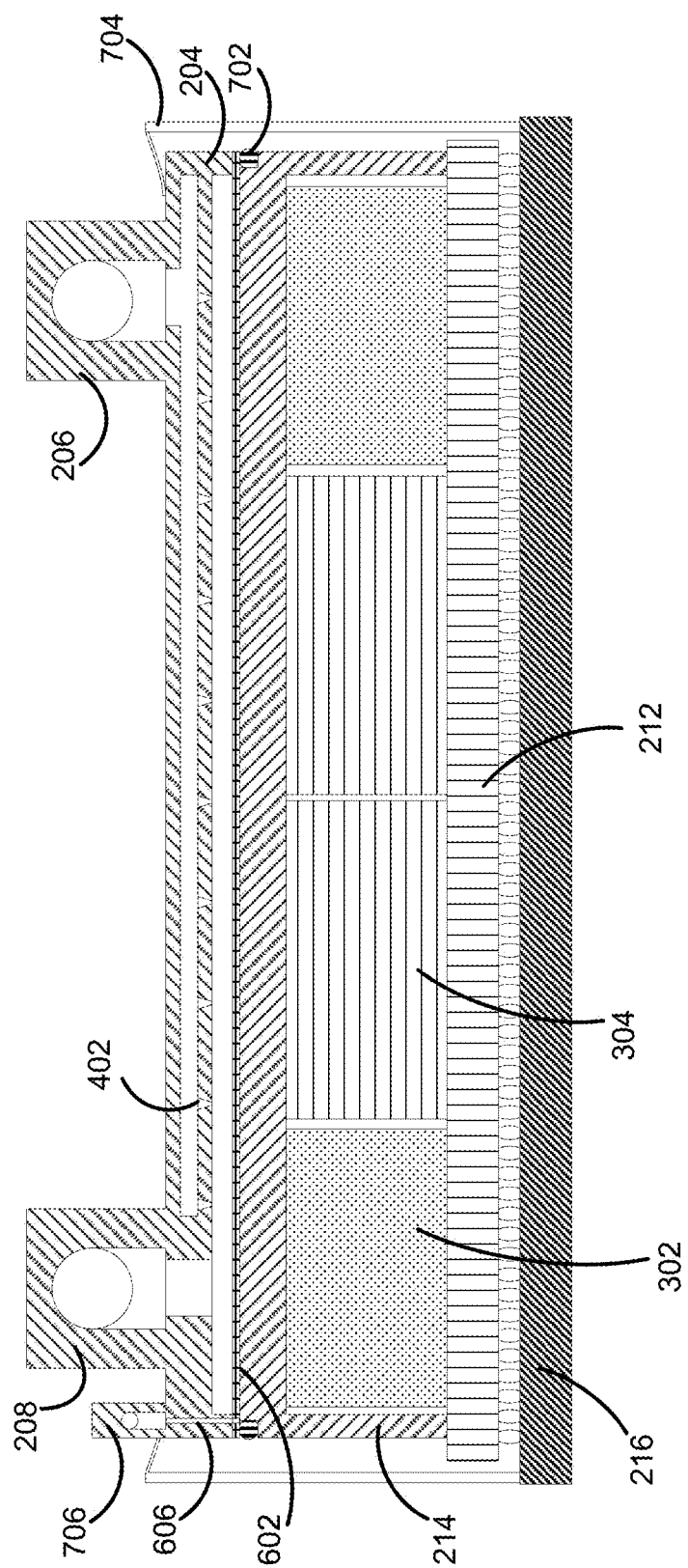
FIG. 7 is a cross-section view of a system with the water block of FIG. 6.

Referring now to FIGS. 6 & 7, in one embodiment, a water block 602 includes a cover 604 that forms a bottom surface of the water block 602 that interfaces with the IHS 214. The water block 602 may otherwise be similar to the water block 602 and may include a base 204, an inlet 206, an outlet 208, etc. In the illustrative embodiment, the cover 604 forms a water-tight seal with the base 204 of the water block 602, such as with an O-ring, mechanical clamping, a sealing compound, crimping, etc. In use, the jet holes 402 direct jets of liquid coolant onto the cover 604, which is thermally coupled to the IHS 214, allowing heat to be transferred from the IHS 214 to the liquid coolant through the cover 604.

In the illustrative embodiment, there is no thermal interface material (TIM) between the cover 604 and the IHS 214. In order to keep strong thermal coupling between the cover 604 and the IHS 214, in the illustrative embodiment, a low pressure is applied to a low-pressure inlet 706, which is connected by a channel 606 through the base 204 and the cover 604. In the illustrative embodiment, the channel 606 is connected to a small volume of space between the cover 604, the IHS 214, and an O-ring 702 that creates an air-tight seal between the IHS 214 and the cover 604. The low-pressure inlet 706 removes air from the volume of space, maintaining the seal. A gas pump is connected to the low-pressure inlet 706 to maintain the low pressure. In some embodiments, the low-pressure inlet 706 maintains a pressure lower than that maintained in the liquid coolant inside the water block 602.

In the illustrative embodiment, the cover 604 is made out of copper. In other embodiments, the cover 604 may be made out of other materials, such as aluminum. In the illustrative embodiment, the O-ring 702 (and other O-rings described herein) are made of ethylene propylene diene monomer (EPDM). In other embodiments, the O-ring 702 (and other O-rings described herein) may be made of any suitable material, such as rubber, silicone, plastic, etc.

In use, the low pressure provided by the low-pressure inlet 706 secures the water block 602 to the IHS 214. When the system is not in use, the water block 602 may be held in place by, e.g., one or more clips 704. It should be appreciated that, as strong thermal coupling between the water block 602 and the IHS 214 is not required when the system is not in use, the clips 704 do not need to apply a large amount of force to the water block 602. Additionally or alternatively to using clips 704, in some embodiments, light bails may be used to retain the water block 602.

Figure 8:
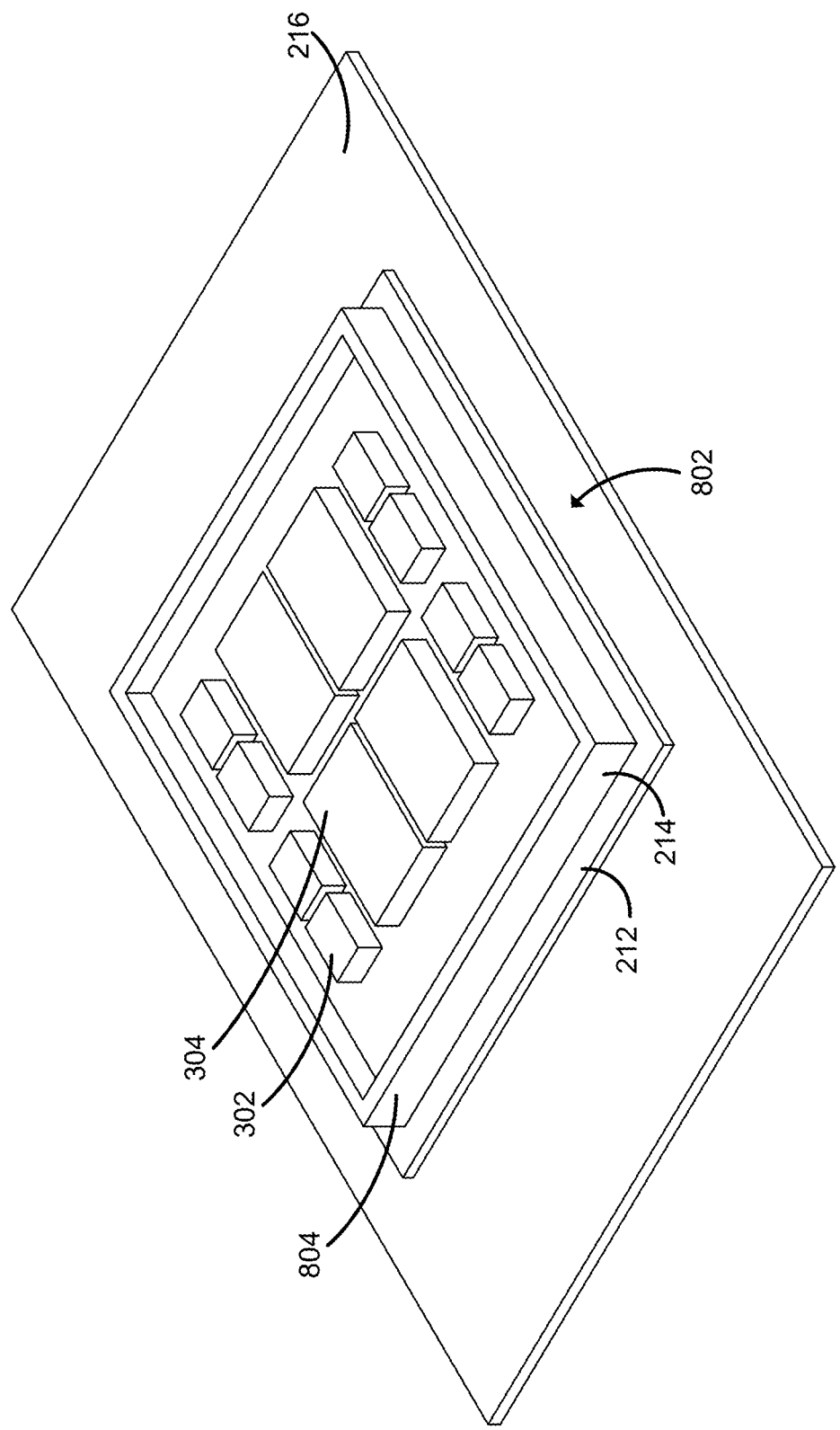
FIG. 8 is a perspective view of a simplified diagram of at least one embodiment of a computing system with an integrated circuit component without an integrated heat spreader.
Figure 9:
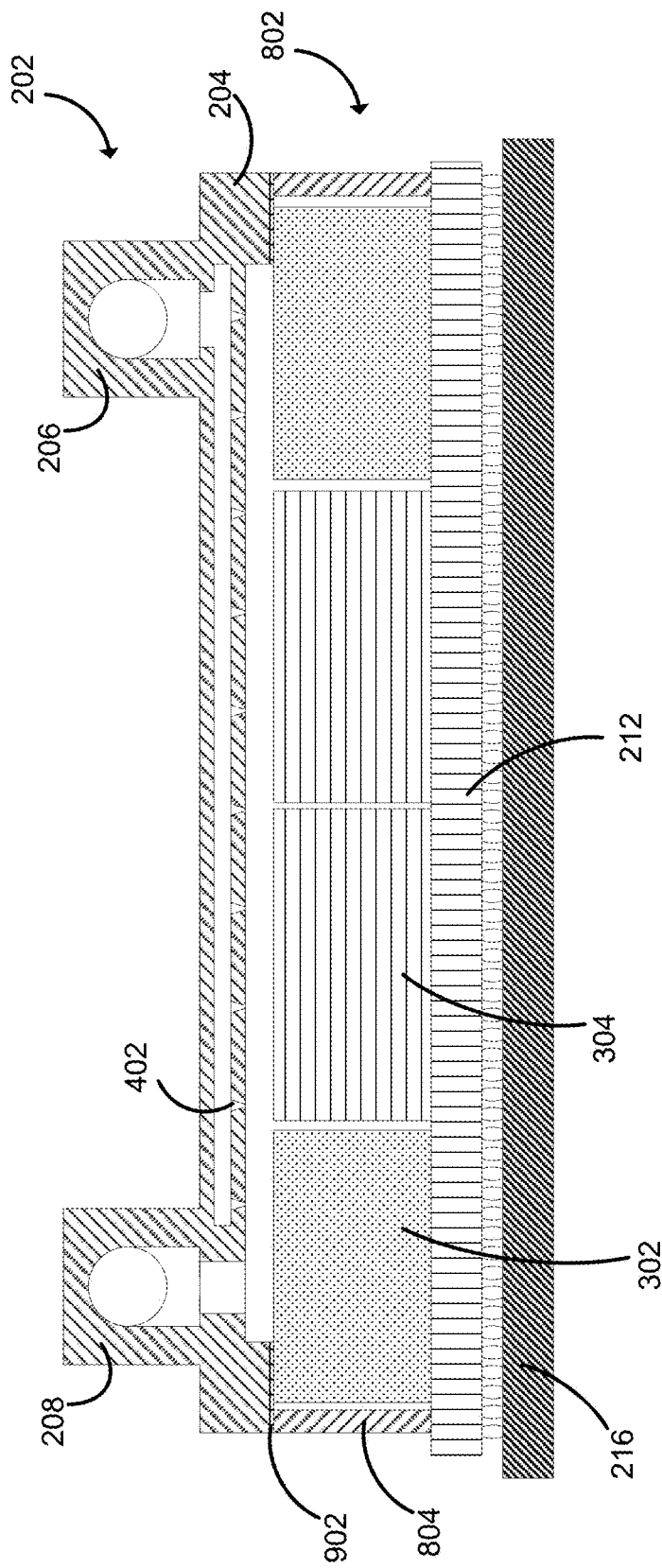
FIG. 9 is a cross-section view of one embodiment of the system of FIG. 8 with a water block.

Referring now to FIGS. 8 & 9, in one embodiment, an integrated circuit component 802 may not include an integrated heat spreader. Rather, the bare dies (such as a processor chip 304 and/or a memory chip 302) may be exposed. The integrated circuit component 802 may otherwise be similar to the integrated circuit component 210, with a processor chip 304, a memory chip 302, a substrate 212, etc. In such an embodiment, jet holes 402 may direct jets of liquid coolant directly onto the dies, as shown in FIG. 9. The elimination of the integrated heat spreader may increase the heat transfer from the direct contact of the dies by the liquid coolant. In one embodiment, the case thermal resistance is 0.009° C./W. In other embodiments, the case thermal resistance may be, e.g., 0.1-0.009° C./W.

In such an embodiment, the integrated circuit component 802 may include a frame 804. The water block 202 may be bonded to the frame 804 by an adhesive 902 between the base 204 of the water block 202 and the frame 804. The frame 804 may be similar to the integrated heat spreader 214 or may be a different material with a lower thermal conductivity. The adhesive 902 may permanently bond the water block 202 to the frame 804 (and/or to a die of the integrated circuit component 802), or the water block 202 may be removable even with the adhesive 902. In some embodiments, the adhesive 902 may form a water-tight seal between the water block 202 and the frame 804 as a result of the negative pressure of the liquid coolant on the inside of the water block 202, resulting in the atmosphere on the outside of the water block 202 pushing down on the water block 202, pressing it onto the frame 804. In other embodiments, the adhesive 902 may form a water-tight seal between the water block 202 and the frame 804 without any pressure difference between the inside and outside of the water block 202. In some embodiments, the packaging of the integrated circuit component 802 may be sealed with epoxy in order to protect solder ball circuits. In the illustrative embodiment, there is no thermal interface material (TIM) or other material between the cover dies 302, 304 of the integrated circuit component 802 and the liquid coolant, increasing the heat transfer from the dies to the liquid coolant.

Figure 10:
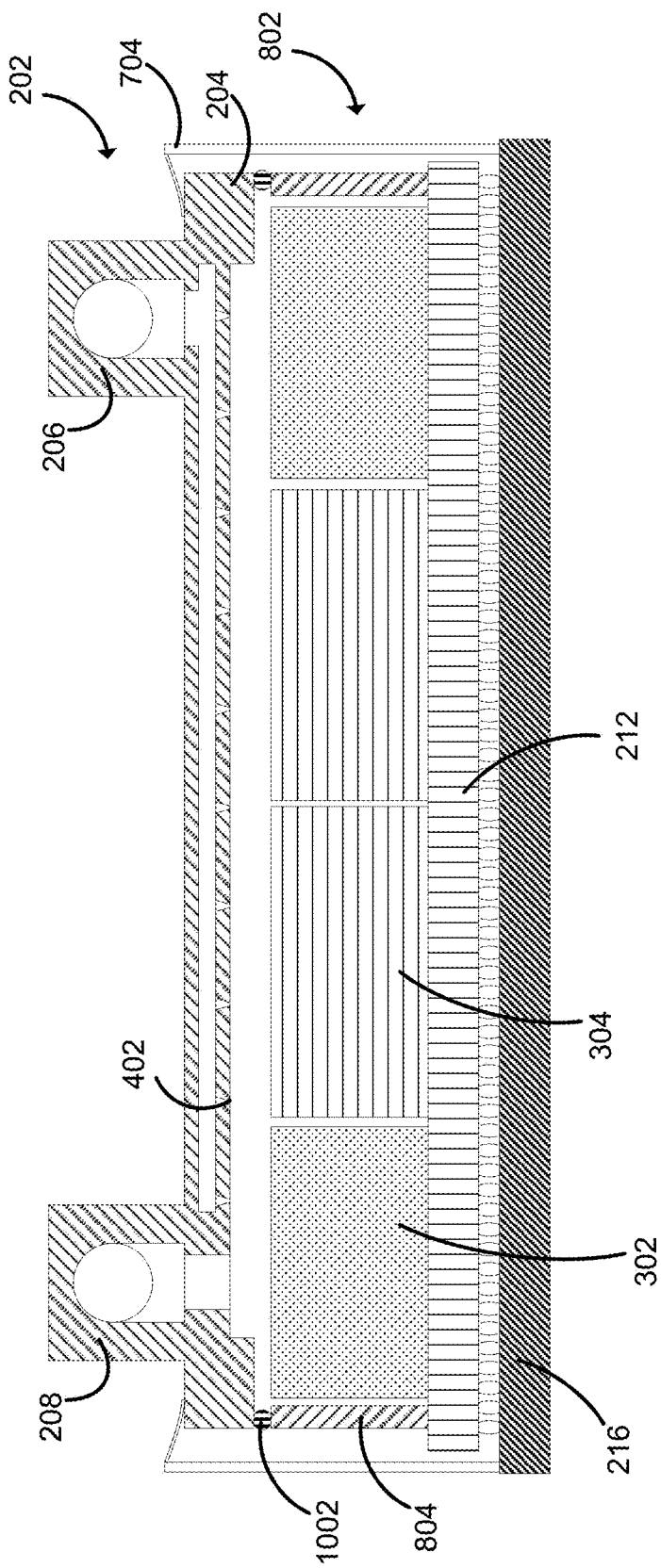
FIG. 10 is a cross-section view of one embodiment of the system of FIG. 8 with a water block.

Referring now to FIG. 10, in one embodiment, the integrated circuit component 802 without an integrated heat spreader can mate with the water block 202 with use of an O-ring 1002. When the system is in use, negative pressure in the liquid coolant inside the water block 202 causes atmospheric pressure to press down on the integrated circuit component, forming a seal between the water block 202 and the integrated circuit component 802 with the O-ring 1002. When the system is not in use, the water block 202 can be held in place with clips 704.

Figure 11:
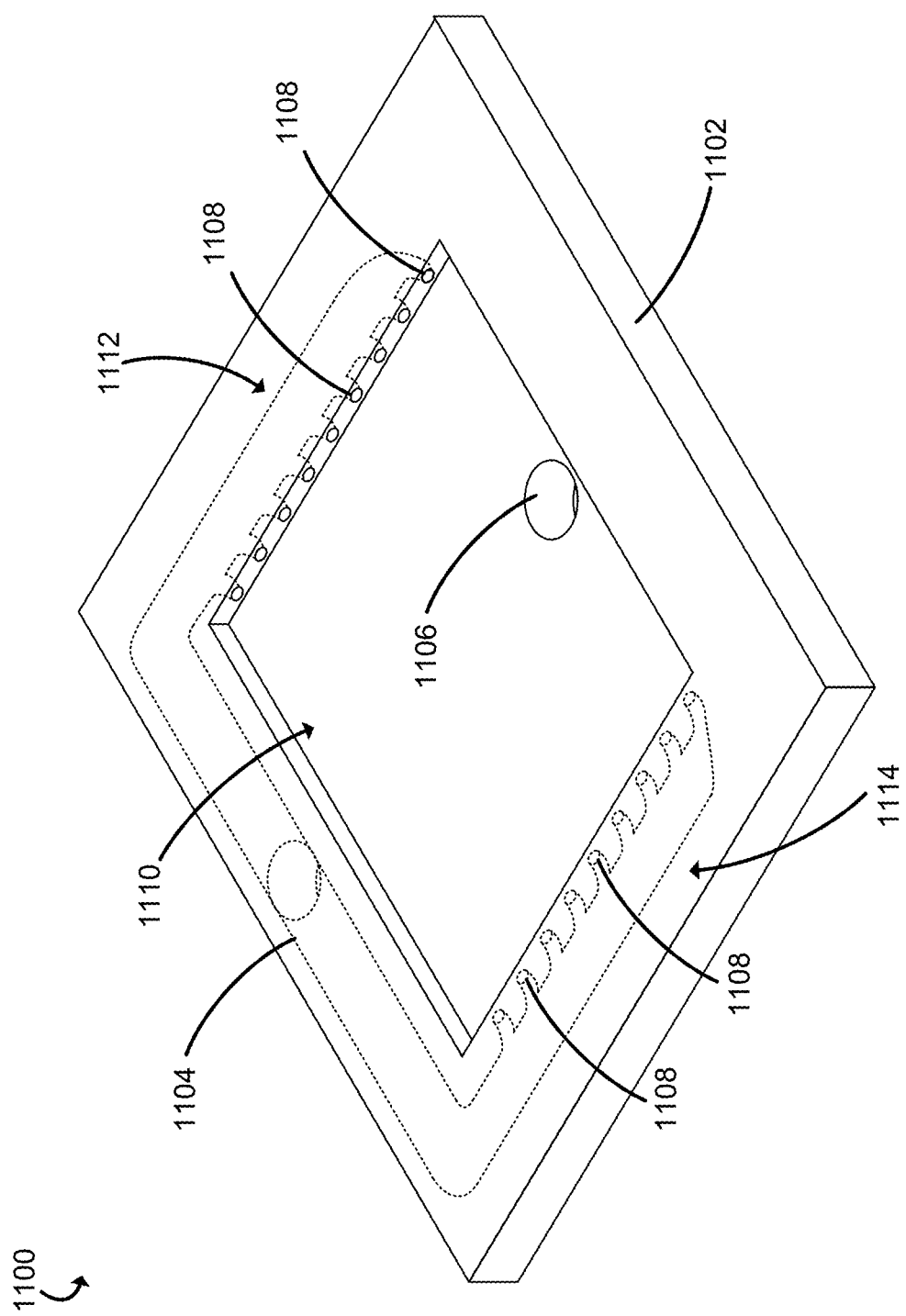
FIG. 11 is a perspective view of a bottom side of one embodiment of the water block of FIG. 2.

Referring now to FIG. 11, in one embodiment, a water block 1100 includes jet holes 1108 that create self-impinging jets. The self-impinging jets create turbulence and/or micro-cavitation to increase the cooling effect of the liquid. FIG. 11 shows a view of a bottom side of the water block 1100. The view of the top side of the water block 1100 may be similar or the same as that of the water block 202 described above, with an inlet and an outlet. A recessed area 1110 is defined in a base 1102 of the water block 1100 that extends from a first set of jet holes 1112 to a second set of jet holes 1114. In the illustrative embodiments, each of the jet holes 1108 is pointed towards a jet hole 1108 on the opposite side of the recessed area 1110. The water block 1100 may be mated with, e.g., an integrated circuit component 210 with an IHS 214 or an integrated circuit component 802 without an integrated heat spreader in a similar manner as the water block 202. In the illustrative embodiment, the self-impinging jets created by the jet holes 1108 may cool a surface by over 150 kW/(m$^2$×° C.). In other embodiments, the self-impinging jets created by the jet holes 1108 may cool a surface by any suitable value, such as 10-150 kW/(m$^2$×° C.).

In use, liquid coolant flows through an inlet to a channel 1104 defined in the base 1102 of the water block 1100. The channel 1104 is connected to the first set of jet holes 1112 and the second set of jet holes 1114. A jet of liquid coolant is created from each jet hole 1108 that is directed toward a corresponding jet from a jet hole 1108 on the opposite side of the recessed area 1110. It should be appreciated that the mixing of the jets results in a high heat transfer from a cooling surface when, e.g., the water block 1100 is mated with an integrated circuit component 210.

Each of the jet holes 1108 may be any suitable size. In the illustrative embodiment, each of the jet holes 1108 is about 500 micrometers in diameter. In other embodiments, the jet holes 1108 may be any suitable diameter, such as 25-1,500 micrometers. In the illustrative embodiment, each of the jet holes 1108 is oriented directly at another jet hole 1108, causing the two jets to travel in parallel but opposite directions, with the jets intersecting at a relative angle of 180°. In other embodiments, the jet holes 1108 may direct jets to intersect at other angles, such as any angle from 20-180°.

The water block 1100 may include any suitable number of jet holes 1108, such as 5-500. The density of jet holes 1108 in each set of jet holes 1112, 1114 may be any suitable value, such as 1-20 per centimeter. In the illustrative embodiment, the water block 11100 includes about 40 jet holes 1108 at a density of about 5 per centimeter.

The recessed area 1110 into which the jets from the jet holes 1108 are directed may be any suitable dimensions. In the illustrative embodiment, the recessed area 1110 is about 1.5 centimeters by 3 centimeters. In other embodiments, the length or width of the recessed area may be any suitable value, such as 1-25 centimeters. In some embodiments, the sets of jet holes 1112, 1114 may extend along a long length, such as 5-500 centimeters, spaced apart by a smaller distance, such as 2 centimeters. The recessed area 1110 may have any suitable height, such as 1-10 millimeters. In the illustrative embodiment, the recessed area 1110 has a height of about 2 millimeters.

It should be appreciated that, in some embodiments, the water-tight seal created between the water blocks 202, 602, 1100 and the corresponding cooling surface (such as an integrated circuit component 210) may be relatively insensitive to mismatch in the coefficient of thermal expansion of the components of the cooling surface and the water blocks 202, 602, 1100. For example, in the embodiment shown in FIG. 10, the O-ring 1002 may maintain a water-tight seal due to the negative pressure in the liquid coolant even if the water block 202 moves relative to the frame 804. In another embodiment shown in FIG. 5, the water block 202 may be flexible, allowing for the IHS 214 to expand, stretching the water block 202 without breaking the seal and without damaging the water block 202.

Although specific embodiments are described above, it should be appreciated that other embodiments are envisioned as well. For example, in FIG. 12, in one embodiment, a water block 1200 with jet holes 1206 may have an inlet 1202 and an outlet 1204 that extend out of the same side of a base of the water block 1200. In another embodiment, in FIG. 13, a water block 1300 with jet holes 1306 has an inlet 1302 extending out of one side of the water block 1300 and an outlet 1304 extending out of the opposite side of the water block 1300. In yet another embodiment, in FIG. 14, a water block 1400 with jet holes 1406 that generate self-impinging jets has an inlet 1402 extending out of one side of the water block 1400 that splits into two channels connected to the base of the water block 1400 and an outlet 1404 extending out of the opposite side of the water block 1400. It should be appreciated that, in embodiments, in which the inlet and outlet are connected to a side of the water block, the inlet and outlet may not add any height to the water block (or may only add a small increase in height).

Figure 16:
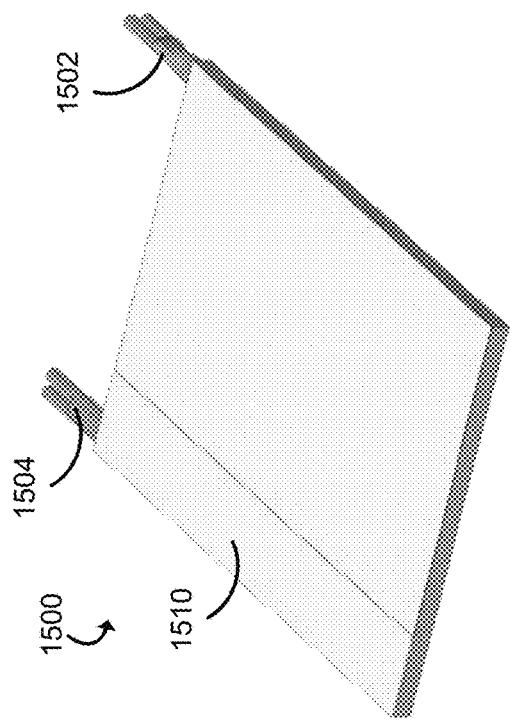
FIG. 16 is a perspective view of the water block of FIG. 15 with a cover.
Figure 18:
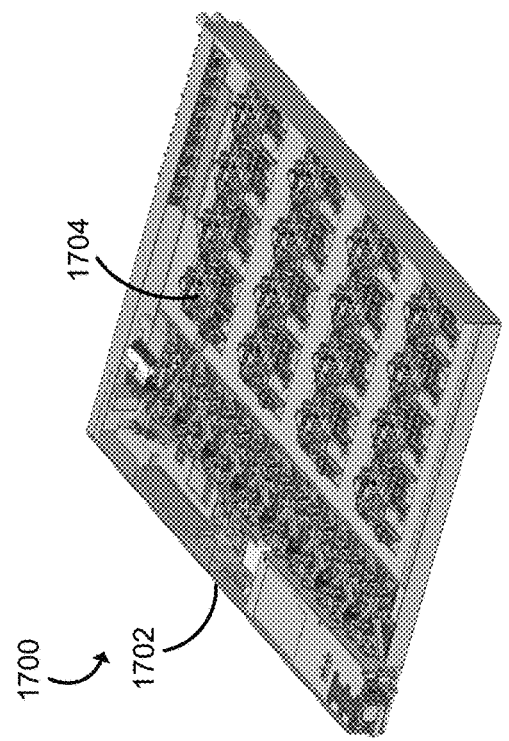
FIG. 18 is a perspective view of the system of FIG. 17 with one or more integrated circuit components.
Figure 15:
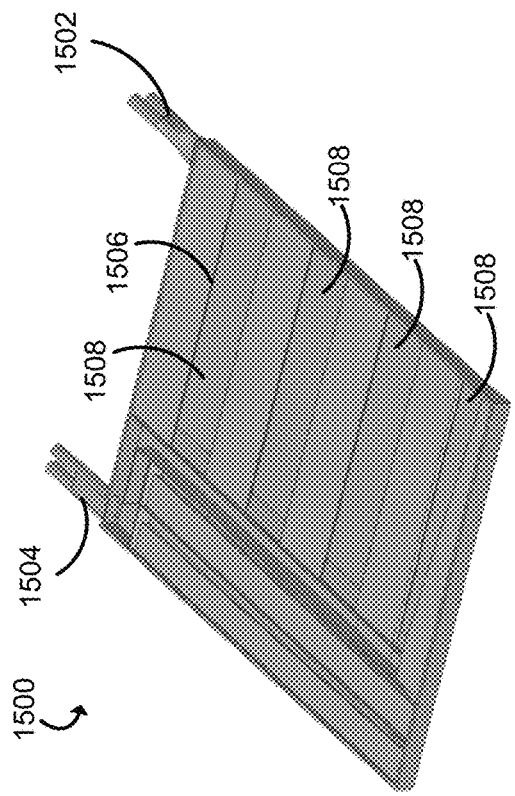
FIG. 15 is a perspective view of one embodiment of a water block.

In some embodiments, in FIG. 15, a water block 1500 has an inlet 1502, an outlet 1506, and several jet holes 1506 that generate jets of liquid coolant directed into a chamber 1508. The water block 1500 may include several chambers 1508. In on embodiment, in use, each chamber 1508 may be thermally coupled to a different integrated circuit component or set of integrated circuit components. In some embodiments, the water block 1500 may have a cover 1510 mated with a base of the water block 1500, as shown in FIG. 16.

Figure 17:
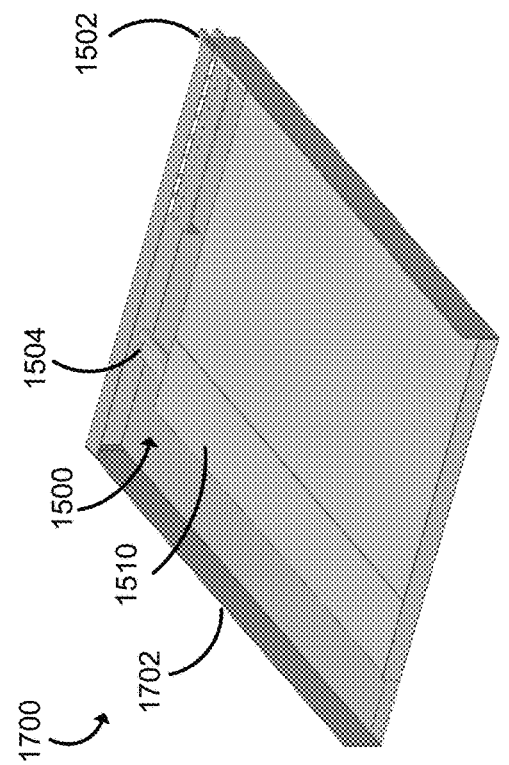
FIG. 17 is a perspective view of one embodiment of a system with a chassis and a water block.

In one embodiment, a system 1700 may include a chassis 1702 with the water block 1500 positioned inside of it. As shown in FIG. 17, in one embodiment, inlet 1502 (or tubing connected to inlet 1502) and outlet 1504 (or tubing connected to outlet 1504) may pass through an opening in the chassis 1702, reducing or eliminating routing of tubing inside the chassis 1702. In the illustrative embodiment, one or more integrated circuit components 1704 may be positioned on top of the over 1510 of the water block 1500. Each integrated circuit component 1704 may be positioned over a chamber 1508 and cooled by liquid coolant jets generated by jet holes 1506.

In another example, instead of a single channel 404 collecting the liquid coolant from the jet holes 402, there may be multiple channels interspersed among the jet holes 402, which may reduce the lateral flow rate of liquid coolant that may otherwise be present under the jet holes 402. As another examples, various aspects of the embodiments described above can be combined with various aspects of other embodiments. For example, the water block 1100 with self-impinging jets can be combined with an integrated circuit component with an IHS, an integrated circuit component without an IHS, an embodiment in which the water block 1100 is bonded to the integrated circuit component, an embodiment in which the liquid coolant in the water block 1100 has a negative pressure, an embodiment in which the liquid coolant in the water block 1100 does not have a negative pressure, an embodiment in which the water block 1100 is sealed to an integrated circuit component with an O-ring, etc. More generally, any suitable embodiment may include an integrated circuit component with or without an IHS, a water block with or without a cover, liquid coolant in the water block that is or is not under negative pressure, etc.

It should be appreciated that, in some embodiments, a water block may include little or no metal parts. For example, the water block 202 as shown in FIG. 5 does not need to include any metal parts. In the illustrative embodiment, the negative pressure on the liquid coolant means that the water blocks, tubing, and other components of the liquid cooling system do not need to withstand burst requirements. As such, the components of the liquid cooling system such as the water blocks and tubing can have relatively thin walls, such as walls that are 0.1-1 millimeter thick.

Although the illustrative embodiments described herein describe an integrated circuit component being cooled, it should be appreciated that other components and systems can be cooled as well. For example, in various embodiments, cooling may be done on a laser, a nuclear reactor, a battery of an electric vehicle, or any other suitable component in need of cooling.

The technologies described herein can be performed by or implemented in any of a variety of computing systems, including mobile computing systems (e.g., smartphones, handheld computers, tablet computers, laptop computers, portable gaming consoles, 2-in-1 convertible computers, portable all-in-one computers), non-mobile computing systems (e.g., desktop computers, servers, workstations, stationary gaming consoles, set-top boxes, smart televisions, rack-level computing solutions (e.g., blades, trays, sleds)), and embedded computing systems (e.g., computing systems that are part of a vehicle, smart home appliance, consumer electronics product or equipment, manufacturing equipment). As used herein, the term "computing system" includes computing devices and includes systems comprising multiple discrete physical components. In some embodiments, the computing systems are located in a data center, such as an enterprise data center (e.g., a data center owned and operated by a company and typically located on company premises), managed services data center (e.g., a data center managed by a third party on behalf of a company), a colocated data center (e.g., a data center in which data center infrastructure is provided by the data center host and a company provides and manages their own data center components (servers, etc.)), cloud data center (e.g., a data center operated by a cloud services provider that host companies applications and data), and an edge data center (e.g., a data center, typically having a smaller footprint than other data center types, located close to the geographic area that it serves).

Figure 19:
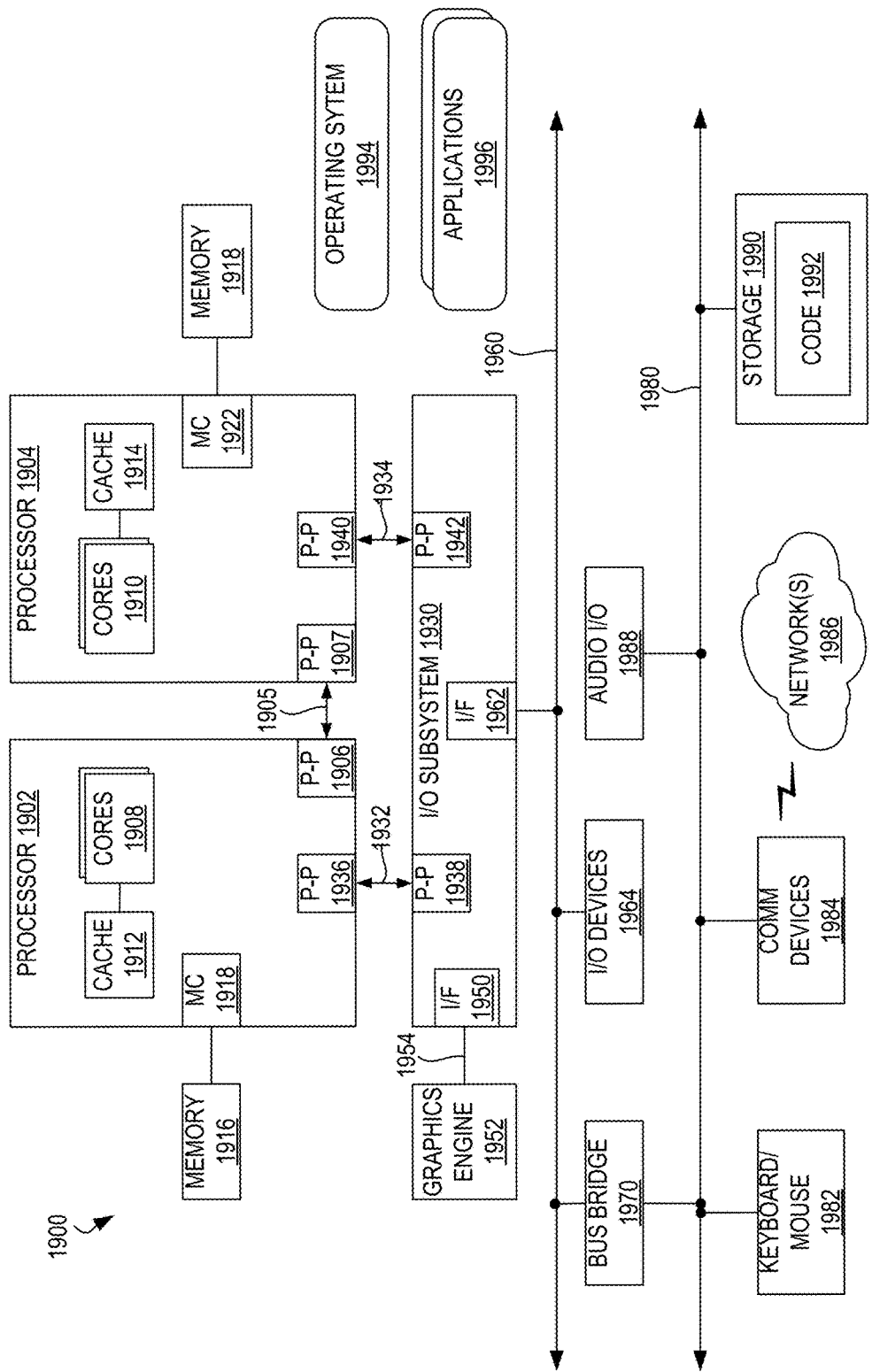
FIG. 19 is a block diagram of an exemplary computing system in which technologies described herein may be implemented.

FIG. 19 is a block diagram of a second example computing system in which technologies described herein may be implemented. Generally, components shown in FIG. 19 can communicate with other shown components, although not all connections are shown, for ease of illustration. The computing system 1900 is a multiprocessor system comprising a first processor unit 1902 and a second processor unit 1904 comprising point-to-point (P-P) interconnects. A point-to-point (P-P) interface 1906 of the processor unit 1902 is coupled to a point-to-point interface 1907 of the processor unit 1904 via a point-to-point interconnection 1905. It is to be understood that any or all of the point-to-point interconnects illustrated in FIG. 19 can be alternatively implemented as a multi-drop bus, and that any or all buses illustrated in FIG. 19 could be replaced by point-to-point interconnects.

The processor units 1902 and 1904 comprise multiple processor cores. Processor unit 1902 comprises processor cores 1908 and processor unit 1904 comprises processor cores 1910. Processor cores 1908 and 1910 can execute computer-executable instructions.

Processor units 1902 and 1904 further comprise cache memories 1912 and 1914, respectively. The cache memories 1912 and 1914 can store data (e.g., instructions) utilized by one or more components of the processor units 1902 and 1904, such as the processor cores 1908 and 1910. The cache memories 1912 and 1914 can be part of a memory hierarchy for the computing system 1900. For example, the cache memories 1912 can locally store data that is also stored in a memory 1916 to allow for faster access to the data by the processor unit 1902. In some embodiments, the cache memories 1912 and 1914 can comprise multiple cache levels, such as level 1 (L1), level 2 (L2), level 3 (L3), level 4 (L4), and/or other caches or cache levels, such as a last level cache (LLC). Some of these cache memories (e.g., L2, L3, L4, LLC) can be shared among multiple cores in a processor unit. One or more of the higher levels of cache levels (the smaller and faster caches) in the memory hierarchy can be located on the same integrated circuit die as a processor core and one or more of the lower cache levels (the larger and slower caches) can be located on an integrated circuit dies that are physically separate from the processor core integrated circuit dies.

Although the computing system 1900 is shown with two processor units, the computing system 1900 can comprise any number of processor units. Further, a processor unit can comprise any number of processor cores. A processor unit can take various forms such as a central processing unit (CPU), a graphics processing unit (GPU), general-purpose GPU (GPGPU), accelerated processing unit (APU), field-programmable gate array (FPGA), neural network processing unit (NPU), data processor unit (DPU), accelerator (e.g., graphics accelerator, digital signal processor (DSP), compression accelerator, artificial intelligence (AI) accelerator), controller, or other types of processing units. As such, the processor unit can be referred to as an XPU (or xPU). Further, a processor unit can comprise one or more of these various types of processing units. In some embodiments, the computing system comprises one processor unit with multiple cores, and in other embodiments, the computing system comprises a single processor unit with a single core. As used herein, the terms "processor unit" and "processing unit" can refer to any processor, processor core, component, module, engine, circuitry, or any other processing element described or referenced herein.

In some embodiments, the computing system 1900 can comprise one or more processor units that are heterogeneous or asymmetric to another processor unit in the computing system. There can be a variety of differences between the processing units in a system in terms of a spectrum of metrics of merit including architectural, microarchitectural, thermal, power consumption characteristics, and the like. These differences can effectively manifest themselves as asymmetry and heterogeneity among the processor units in a system.

The processor units 1902 and 1904 can be located in a single integrated circuit component (such as a multi-chip package (MCP) or multi-chip module (MCM)) or they can be located in separate integrated circuit components. An integrated circuit component comprising one or more processor units can comprise additional components, such as embedded DRAM, stacked high bandwidth memory (HBM), shared cache memories (e.g., L3, L4, LLC), input/output (I/O) controllers, or memory controllers. Any of the additional components can be located on the same integrated circuit die as a processor unit, or on one or more integrated circuit dies separate from the integrated circuit dies comprising the processor units. In some embodiments, these separate integrated circuit dies can be referred to as "chiplets". In some embodiments where there is heterogeneity or asymmetry among processor units in a computing system, the heterogeneity or asymmetric can be among processor units located in the same integrated circuit component.

Processor units 1902 and 1904 further comprise memory controller logic (MC) 1920 and 1922. As shown in FIG. 19, MCs 1920 and 1922 control memories 1916 and 1918 coupled to the processor units 1902 and 1904, respectively. The memories 1916 and 1918 can comprise various types of volatile memory (e.g., dynamic random-access memory (DRAM), static random-access memory (SRAM)) and/or non-volatile memory (e.g., flash memory, chalcogenide-based phase-change non-volatile memories), and comprise one or more layers of the memory hierarchy of the computing system. While MCs 1920 and 1922 are illustrated as being integrated into the processor units 1902 and 1904, in alternative embodiments, the MCs can be external to a processor unit.

Processor units 1902 and 1904 are coupled to an Input/Output (I/O) subsystem 1930 via point-to-point interconnections 1932 and 1934. The point-to-point interconnection 1932 connects a point-to-point interface 1936 of the processor unit 1902 with a point-to-point interface 1938 of the I/O subsystem 1930, and the point-to-point interconnection 1934 connects a point-to-point interface 1940 of the processor unit 1904 with a point-to-point interface 1942 of the I/O subsystem 1930. Input/Output subsystem 1930 further includes an interface 1950 to couple the I/O subsystem 1930 to a graphics engine 1952. The I/O subsystem 1930 and the graphics engine 1952 are coupled via a bus 1954.

The Input/Output subsystem 1930 is further coupled to a first bus 1960 via an interface 1962. The first bus 1960 can be a Peripheral Component Interconnect Express (PCIe) bus or any other type of bus. Various I/O devices 1964 can be coupled to the first bus 1960. A bus bridge 1970 can couple the first bus 1960 to a second bus 1980. In some embodiments, the second bus 1980 can be a low pin count (LPC) bus. Various devices can be coupled to the second bus 1980 including, for example, a keyboard/mouse 1982, audio I/O devices 1988, and a storage device 1990, such as a hard disk drive, solid-state drive, or another storage device for storing computer-executable instructions (code) 1992 or data. The code 1992 can comprise computer-executable instructions for performing methods described herein. Additional components that can be coupled to the second bus 1980 include communication device(s) 1984, which can provide for communication between the computing system 1900 and one or more wired or wireless networks 1986 (e.g. Wi-Fi, cellular, or satellite networks) via one or more wired or wireless communication links (e.g., wire, cable, Ethernet connection, radio-frequency (RF) channel, infrared channel, Wi-Fi channel) using one or more communication standards (e.g., IEEE 802.11 standard and its supplements).

In embodiments where the communication devices 1984 support wireless communication, the communication devices 1984 can comprise wireless communication components coupled to one or more antennas to support communication between the computing system 1900 and external devices. The wireless communication components can support various wireless communication protocols and technologies such as Near Field Communication (NFC), IEEE 802.11 (Wi-Fi) variants, WiMax, Bluetooth, Zigbee, 4G Long Term Evolution (LTE), Code Division Multiplexing Access (CDMA), Universal Mobile Telecommunication System (UMTS) and Global System for Mobile Telecommunication (GSM), and 5G broadband cellular technologies. In addition, the wireless modems can support communication with one or more cellular networks for data and voice communications within a single cellular network, between cellular networks, or between the computing system and a public switched telephone network (PSTN).

The system 1900 can comprise removable memory such as flash memory cards (e.g., SD (Secure Digital) cards), memory sticks, Subscriber Identity Module (SIM) cards). The memory in system 1900 (including caches 1912 and 1914, memories 1916 and 1918, and storage device 1990) can store data and/or computer-executable instructions for executing an operating system 1994 and application programs 1996. Example data includes web pages, text messages, images, sound files, and video data to be sent to and/or received from one or more network servers or other devices by the system 1900 via the one or more wired or wireless networks 1986, or for use by the system 1900. The system 1900 can also have access to external memory or storage (not shown) such as external hard drives or cloud-based storage.

The operating system 1994 can control the allocation and usage of the components illustrated in FIG. 19 and support the one or more application programs 1996. The application programs 1996 can include common computing system applications (e.g., email applications, calendars, contact managers, web browsers, messaging applications) as well as other computing applications.

The computing system 1900 can support various additional input devices, such as a touchscreen, microphone, monoscopic camera, stereoscopic camera, trackball, touchpad, trackpad, proximity sensor, light sensor, electrocardiogram (ECG) sensor, PPG (photoplethysmogram) sensor, galvanic skin response sensor, and one or more output devices, such as one or more speakers or displays. Other possible input and output devices include piezoelectric and other haptic I/O devices. Any of the input or output devices can be internal to, external to, or removably attachable with the system 1900. External input and output devices can communicate with the system 1900 via wired or wireless connections.

In addition, the computing system 1900 can provide one or more natural user interfaces (NUIs). For example, the operating system 1994 or applications 1996 can comprise speech recognition logic as part of a voice user interface that allows a user to operate the system 1900 via voice commands. Further, the computing system 1900 can comprise input devices and logic that allows a user to interact with computing the system 1900 via body, hand, or face gestures.

The system 1900 can further include at least one input/output port comprising physical connectors (e.g., USB, IEEE 1394 (FireWire), Ethernet, RS-232), a power supply (e.g., battery), a global satellite navigation system (GNSS) receiver (e.g., GPS receiver); a gyroscope; an accelerometer; and/or a compass. A GNSS receiver can be coupled to a GNSS antenna. The computing system 1900 can further comprise one or more additional antennas coupled to one or more additional receivers, transmitters, and/or transceivers to enable additional functions.

It is to be understood that FIG. 19 illustrates only one example computing system architecture. Computing systems based on alternative architectures can be used to implement technologies described herein. For example, instead of the processor units 1902 and 1904 and the graphics engine 1952 being located on discrete integrated circuits, a computing system can comprise an SoC (system-on-a-chip) integrated circuit incorporating multiple processors, a graphics engine, and additional components. Further, a computing system can connect its constituent component via bus or point-to-point configurations different from that shown in FIG. 19. Moreover, the illustrated components in FIG. 19 are not required or all-inclusive, as shown components can be removed and other components added in alternative embodiments.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrase "at least one of A, B or C" can mean A; B; C; A and B; A and C; B and C; or A, B, and C. Moreover, as used in this application and in the claims, a list of items joined by the term "one or more of" can mean any combination of the listed terms. For example, the phrase "one or more of A, B and C" can mean A; B; C; A and B; A and C; B and C; or A, B, and C.

The disclosed methods, apparatuses, and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved.

Theories of operation, scientific principles or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

Although the operations of some of the disclosed methods are described in a particular, sequential order for convenient presentation, it is to be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

EXAMPLES

Illustrative examples of the technologies disclosed herein are provided below. An embodiment of the technologies may include any one or more, and any combination of, the examples described below.

Example 1 includes a water block comprising a base; an inlet; and an outlet, wherein a plurality of jet holes is defined in the base of the water block, wherein each of the inlet and the outlet is fluidly coupled to each of the plurality of jet holes, wherein each of the plurality of jet holes is configured to create a jet of fluid coolant when fluid coolant is passed from the inlet and through the corresponding jet hole, wherein each of the plurality of jet holes is configured to direct the corresponding jet of fluid coolant toward the jet of fluid coolant from a different jet hole of the plurality of jet holes.

Example 2 includes the subject matter of Example 1, and wherein the plurality of jet holes provide a cooling of over 100 kilowatts per square meter per degree Celsius.

Example 3 includes a system comprising the water block of claim 1, further comprising an integrated circuit component, wherein fluid coolant from the jet of fluid coolant from each of the plurality of jet holes is to directly contact a die of the integrated circuit component.

Example 4 includes the subject matter of Example 3, and wherein the water block is permanently bonded to the integrated circuit component to create a seal.

Example 5 includes the subject matter of any of Examples 3 and 4, and further including a gas pump to apply negative pressure to a coolant loop connected to the inlet and the outlet, an O-ring between the water block and the integrated circuit component, wherein a seal is created by the O-ring between the water block and the integrated circuit component upon application of the negative pressure to the coolant loop.

Example 6 includes a system comprising the water block of claim 1, further comprising an integrated circuit component, wherein fluid coolant from the jet of fluid coolant from each of the plurality of jet holes is to directly contact an integrated heat spreader of the integrated circuit component.

Example 7 includes the subject matter of Example 6, and wherein the water block comprises a cover forming a seal with the base of the water block, wherein the cover is thermally coupled to the integrated heat spreader.

Example 8 includes the subject matter of any of Examples 6 and 7, and further including an O-ring between the cover of the water block and the integrated heat spreader, wherein negative pressure is applied to a volume of space between the water block and the integrated heat spreader.

Example 9 includes a system comprising the water block of claim 1, further comprising an integrated circuit component, wherein a case thermal resistance of the integrated circuit component is less than 0.02 degrees Celsius per Watt.

Example 10 includes a system comprising an integrated circuit component; a water block comprising a base, an inlet, and an outlet; and wherein the water block is mated with the integrated circuit component to create a seal between the water block and the integrated circuit component, wherein the water block is configured to apply fluid coolant from the inlet directly to a die of the integrated circuit component.

Example 11 includes the subject matter of Example 10, and wherein the water block is permanently bonded to the integrated circuit component to create a seal.

Example 12 includes the subject matter of any of Examples 10 and 11, and further including a gas pump to apply negative pressure to a coolant loop connected to the inlet and the outlet.

Example 13 includes the subject matter of any of Examples 10-12, and further including an O-ring between the water block and the integrated circuit component, wherein a seal is created by the O-ring between the water block and the integrated circuit component upon application of the negative pressure to the coolant loop.

Example 14 includes the subject matter of any of Examples 10-13, and wherein a case thermal resistance of the integrated circuit component is less than 0.02 degrees Celsius per Watt.

Example 15 includes the subject matter of any of Examples 10-14, and further including a rack comprising a plurality of computing systems, wherein a first computing system of the plurality of computing systems comprises the integrated circuit component and the water block.

Example 16 includes the subject matter of any of Examples 10-15, and further including a plurality of integrated circuit components, wherein the water block is thermally coupled to each of the plurality of integrated circuits.

Example 17 includes a system comprising an integrated circuit component; a water block comprising a base, an inlet, and an outlet; and a gas pump to apply negative pressure to a coolant loop connected to the inlet and the outlet, wherein a plurality of jet holes is defined in the base of the water block, wherein each of the inlet and the outlet is fluidly coupled to each of the plurality of jet holes, wherein each jet hole of the plurality of jet holes is configured to apply a jet of fluid coolant toward the integrated circuit component when fluid coolant is passed from the inlet and through the corresponding jet hole.

Example 18 includes the subject matter of Example 17, and wherein each of the plurality of jet holes is configured to apply a jet of fluid coolant directly to a die of the integrated circuit component.

Example 19 includes the subject matter of any of Examples 17 and 18, and wherein the water block is permanently bonded to the integrated circuit component to create a seal.

Example 20 includes the subject matter of any of Examples 17-19, and further including an O-ring between the water block and the integrated circuit component, wherein a seal is created by the O-ring between the water block and the integrated circuit component upon application of the negative pressure to the coolant loop.

Example 21 includes the subject matter of any of Examples 17-20, and wherein each of the plurality of jet holes is configured to apply a jet of fluid coolant directly to an integrated heat spreader of the integrated circuit component.

Example 22 includes the subject matter of any of Examples 17-21, and wherein the water block comprises a cover, wherein the base and the cover surround a chamber defined in the water block, wherein the cover forms a seal with the base of the water block, wherein the cover is thermally coupled to an integrated heat spreader of the integrated circuit component, wherein each of the plurality of jet holes is configured to apply a jet of fluid coolant directly to the cover.

Example 23 includes the subject matter of any of Examples 17-22, and further including an O-ring between the cover of the water block and the integrated heat spreader, wherein negative pressure is applied to a volume of space between the water block and the integrated heat spreader.

Example 24 includes the subject matter of any of Examples 17-23, and wherein the cover is directly in contact with the integrated heat spreader without use of a thermal interface material.

Example 25 includes the subject matter of any of Examples 17-24, and wherein each of the jet holes is separated from the integrated circuit component by a distance of less than 300 micrometers.

Example 26 includes the subject matter of any of Examples 17-25, and wherein the plurality of jet holes provide a cooling of over 100 kilowatts per square meter per degree Celsius.

Example 27 includes the subject matter of any of Examples 17-26, and wherein a case thermal resistance of the integrated circuit component is less than 0.02 degrees Celsius per Watt.

Example 28 includes the subject matter of any of Examples 17-27, and further including the coolant loop.

Example 29 includes the subject matter of any of Examples 17-28, and further including a rack comprising a plurality of computing systems, wherein a first computing system of the plurality of computing systems comprises the integrated circuit component and the water block.

Example 30 includes the subject matter of any of Examples 17-29, and further including a plurality of integrated circuit components, wherein the water block is thermally coupled to each of the plurality of integrated circuits.

Example 31 includes a system comprising an integrated circuit component; a water block comprising a base, an inlet, and an outlet; and means for creating jets of fluid coolant in the water block to cool the integrated circuit component; and means for creating a seal between the water block and the integrated circuit component.

Example 32 includes the subject matter of Example 31, and wherein the means for creating jets of fluid coolant is configured to apply fluid coolant directly to a die of the integrated circuit component.

Example 33 includes the subject matter of any of Examples 31 and 32, and wherein the water block is permanently bonded to the integrated circuit component to create a seal.

Example 34 includes the subject matter of any of Examples 31-33, and further including an O-ring between the water block and the integrated circuit component, wherein a seal is created by the O-ring between the water block and the integrated circuit component upon application of negative pressure to fluid coolant in the water block.

Example 35 includes the subject matter of any of Examples 31-34, and wherein the means for creating jets of fluid coolant is configured to apply fluid coolant directly to an integrated heat spreader of the integrated circuit component.

Example 36 includes the subject matter of any of Examples 31-35, and wherein the water block comprises a cover forming a seal with the base of the water block, wherein the cover is thermally coupled to the integrated heat spreader.

Example 37 includes the subject matter of any of Examples 31-36, and further including an O-ring between the cover of the water block and the integrated heat spreader, wherein negative pressure is applied to a volume of space between the water block and the integrated heat spreader.

Example 38 includes the subject matter of any of Examples 31-37, and wherein the means for creating jets of fluid coolant in the water block to cool the integrated circuit component provide a cooling of over 100 kilowatts per square meter per degree Celsius.

Example 39 includes the subject matter of any of Examples 31-38, and wherein a case thermal resistance of the integrated circuit component is less than 0.02 degrees Celsius per Watt.

Example 40 includes the subject matter of any of Examples 31-39, and further including a rack comprising a plurality of computing systems, wherein a first computing system of the plurality of computing systems comprises the integrated circuit component and the water block.

Example 41 includes the subject matter of any of Examples 31-40, and further including a plurality of integrated circuit components, wherein the water block is thermally coupled to each of the plurality of integrated circuits.

The invention claimed is:
1. A system comprising:
an integrated circuit component;
a water block including:
a base;
an inlet;
an outlet; and
a plurality of jet holes defined in the base, wherein each of the inlet and the outlet is fluidly coupled to each of the plurality of jet holes, wherein each of the plurality of jet holes is configured to create a jet of fluid coolant when fluid coolant is passed from the inlet and through the corresponding jet hole, and wherein each of the plurality of jet holes is configured to direct the corresponding jet of fluid coolant toward the jet of fluid coolant from a different jet hole of the plurality of jet holes; and
an O-ring between the water block and the integrated circuit component.

2. The system of claim 1, wherein the plurality of jet holes is to provide a cooling of over 100 kilowatts per square meter per degree Celsius.

3. The system of claim 1, wherein fluid coolant from the jet of fluid coolant from each of the plurality of jet holes is to directly contact a die of the integrated circuit component.

4. The system of claim 1, the system further comprising:
a gas pump to apply negative pressure to a coolant loop connected to the inlet and the outlet, wherein a seal is created by the O-ring between the water block and the integrated circuit component upon application of the negative pressure to the coolant loop.

5. The system of claim 1, wherein fluid coolant from the jet of fluid coolant from each of the plurality of jet holes is to directly contact an integrated heat spreader of the integrated circuit component.

6. The system of claim 1, wherein the water block comprises a cover forming a seal with the base of the water block, wherein the cover is thermally coupled to an integrated heat spreader of the integrated circuit component.

7. The system of claim 6, wherein the O-ring is between the cover of the water block and the integrated heat spreader, wherein negative pressure is applied to a volume of space between the water block and the integrated heat spreader.

8. The system of claim 1, wherein a case thermal resistance of the integrated circuit component is less than 0.02 degrees Celsius per Watt.

9. A system comprising:
an integrated circuit component;

a water block comprising a base, an inlet, and an outlet; and wherein the water block is mated with the integrated circuit component to create a seal between the water block and the integrated circuit component, wherein the water block is configured to apply fluid coolant from the inlet directly onto a die of the integrated circuit component.

10. The system of claim 9, wherein the water block is permanently bonded to the integrated circuit component to create the seal.

11. The system of claim 9, further comprising a gas pump to apply negative pressure to a coolant loop connected to the inlet and the outlet.

12. The system of claim 11, further comprising an O-ring between the water block and the integrated circuit component, wherein the seal is created by the O-ring between the water block and the integrated circuit component upon application of the negative pressure to the coolant loop.

13. A system comprising:

an integrated circuit component;

a water block comprising a base, an inlet, and an outlet; and a gas pump to apply negative pressure to a coolant loop connected to the inlet and the outlet, wherein a plurality of jet holes is defined in the base of the water block, wherein each of the inlet and the outlet is fluidly coupled to each of the plurality of jet holes, wherein each jet hole of the plurality of jet holes is configured to apply a jet of fluid coolant toward the integrated circuit component when fluid coolant is passed from the inlet and through the corresponding jet hole.

14. The system of claim 13, wherein each of the plurality of jet holes is configured to apply a jet of fluid coolant directly to a die of the integrated circuit component.

15. The system of claim 14, further comprising an O-ring between the water block and the integrated circuit component, wherein a seal is created by the O-ring between the water block and the integrated circuit component upon application of the negative pressure to the coolant loop.

16. The system of claim 13, wherein the water block comprises a cover, wherein the base and the cover surround a chamber defined in the water block, wherein the cover forms a seal with the base of the water block, wherein the cover is thermally coupled to an integrated heat spreader of the integrated circuit component, wherein each of the plurality of jet holes is configured to apply a jet of fluid coolant directly to the cover.

17. The system of claim 16, further comprising an O-ring between the cover of the water block and the integrated heat spreader, wherein the negative pressure is applied to a volume of space between the water block and the integrated heat spreader.

18. The system of claim 17, wherein the cover is directly in contact with the integrated heat spreader without use of a thermal interface material.

19. The system of claim 13, wherein each of the jet holes is separated from the integrated circuit component by a distance of less than 300 micrometers.

* * * * *